United States Patent [19]

Rabalais et al.

[11] Patent Number: 5,374,318
[45] Date of Patent: Dec. 20, 1994

[54] PROCESS FOR THE DEPOSITION OF DIAMOND FILMS USING LOW ENERGY, MASS-SELECTED ION BEAM DEPOSITION

[75] Inventors: John W. Rabalais, Houston, Tex.; Srinandan R. Kasi, Croton-On-Hudson, N.Y.

[73] Assignee: University of Houston, Houston, Tex.

[21] Appl. No.: 348,727

[22] PCT Filed: Jun. 27, 1988

[86] PCT No.: PCT/US88/02225
§ 371 Date: Feb. 24, 1989
§ 102(e) Date: Feb. 24, 1989

Related U.S. Application Data

[63] Continuation-in-part of Ser. No. 67,298, Jun. 25, 1987, Pat. No. 4,822,466.

[51] Int. Cl.$^5$ .............. H01L 21/00; H01L 21/02; H01L 29/00; H01L 21/469
[52] U.S. Cl. .............. 148/33; 437/225; 437/228; 437/233
[58] Field of Search .............. 204/192.15, 192.22, 204/19.31; 437/16, 105, 225, 228, 233; 250/281, 492.2, 492.3; 148/33

[56] References Cited

U.S. PATENT DOCUMENTS

| | | | |
|---|---|---|---|
| 3,669,861 | 6/1972 | Cash, Jr. et al. | 204/192.37 |
| 4,181,544 | 1/1980 | Cho | 437/925 |
| 4,292,093 | 9/1981 | Ownby et al. | 437/946 |
| 4,559,096 | 12/1985 | Friedman et al. | 437/235 |
| 4,579,609 | 4/1986 | Reif et al. | 427/39 |

OTHER PUBLICATIONS

Tokuyama, T., Low-energy Mass-separated ion beam deposition of materials, Nucl. Inst. & Meth., 182/183, (1981), pp. 241–250.

Freeman, Jr., The epitaxial synthesis of diamond by the deposition of low energy carbon ions, Vacuum, vol. 34, Nos. 1-2, pp. 305–314, 1984.

Vossen, J., Preparation of surfaces for high quality interface formation, J. Vac. Sci. Tech. A2(2), Apr.-Jun. 1984, pp. 212–215.

Amano, J., Thin film deposition using low energy ion beams I System specifications and design, J. Vac. Sci. Tech, vol. 13, No. 2, Mar./Apr. 1976, pp. 591–595.

Tachi, S., Plasma etching mech. of silicon studied by mass-selected ion beam irradiation technique, Semiconductor Tech., 1984, pp. 343–357.

Mirtich, M., Dual Ion Beam Deposit. of Carbon Films with Diamondlike Properties, Eleventh International Conference on Metallurgical Coatings, Apr. 9, 1984, pp. 1–18.

Ghandhi, S., VLSI Fabrication Principles, Chap. 9, pp. 476–477, 1983.

Wolf, S., Silicon Processing for the VLSI Era, vol. 1, Chap. 9, pp. 280–282.

*Primary Examiner*—Brian E. Hearn
*Assistant Examiner*—B. Everhart
*Attorney, Agent, or Firm*—Arnold, White & Durkee

[57] ABSTRACT

A low energy (10 to 300 eV), mass-selected ion beam is used to deposit thin films on atomically clean substrate surfaces. For example, a $C^+$ ion beam may be used to deposit a chemically bonded diamond or diamondlike film on a substrate at room temperature. For thin carbon films, the initial monolayer of the deposited film is in the form of a carbide layer which is chemically bonded to the substrate atoms. The film evolves gradually over the next several layers deposited, through intermediate structures, into a diamond structure. The optimum $C^+$ energy range for formation of the diamond structure is about 30 to 175 eV. Below 10 eV the final diamond structure has not been attained and above 180 eV there is a sharp increase in the dose required to attain this final structure. Multiple ion beams may be used to deposit multicomponent films including films doped with very low concentrations of foreign atoms. The diamond films produced by this process are found to be free of impurities, inert to $O_2$ chemisorption, structurally stable up to 350° C., have a low sputtering yield, and have a sharp interface with the substrate surface. Applications for such films include protective coatings, insulators, and doped semiconductors.

8 Claims, 7 Drawing Sheets

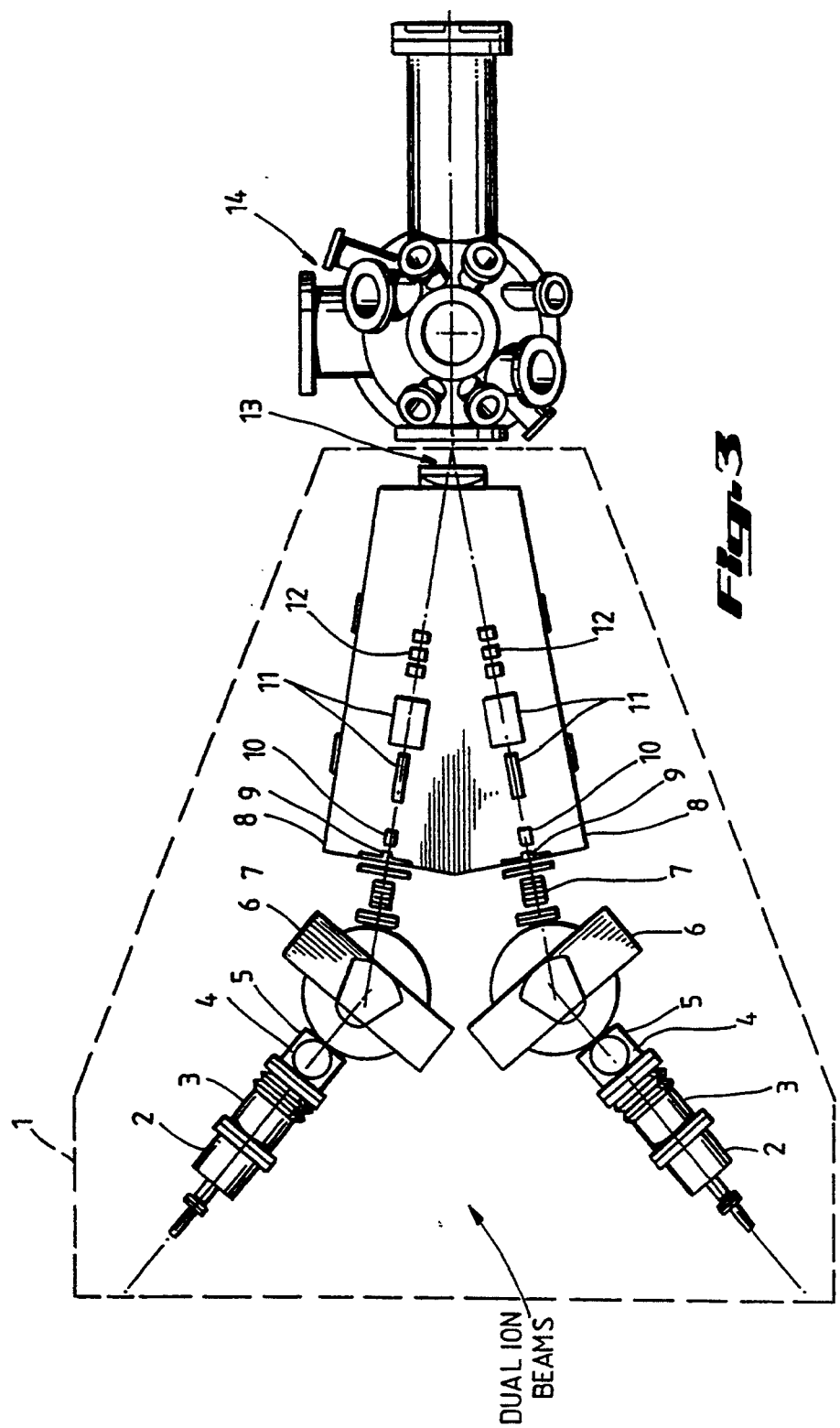

PROCESS FOR THE DEPOSITION OF DIAMOND FILMS USING LOW ENERGY, MASS-SELECTED ION BEAM DEPOSITION

CROSS-REFERENCES TO RELATED APPLICATIONS

This application is a continuation-in-part of application Ser. No. 067,298, filed Jun. 25, 1987 now U.S. Pat. No. 4,822,466.

BACKGROUND OF THE INVENTION

1. Field of the Invention

This invention relates to the production of thin, chemically bonded diamond or diamondlike films. More particularly, it relates to such films produced by ion beam deposition.

2. Description of Related Art

Deposition of diamondlike carbon films has been the subject of intense research for about thirty years. This research has accelerated markedly during the past few years. The basic interest in diamondlike carbon films stems from the unique set of physical properties of diamond: it is the hardest material known; it is an excellent electrical insulator yet is the best thermal conductor known; it has high dielectric strength, and is highly transparent in the ultraviolet, visible and infrared regions of the spectrum; it is chemically inert and therefore resistant to oxidation and corrosion; and, it is biologically compatible with body tissues.

Attempts to fabricate true diamond films have resulted in carbon films having properties which vary over a range of many orders of magnitude. For example, the electrical resistivity of such films has been reported to vary between $10^{-2}$ and $10^{12}$ ohm-cm. The unique characteristics of some of these films and the possibility of "tailoring" a combination of desired properties for a specific purpose result in many advantages of such films for a variety of applications. Proposed applications include: optical coatings (in particular for hazardous environments and outer space); protective thin film coatings for magnetic recording media (e.g., computer disks); heat sinks and high thermal conductivity coatings for semiconductor applications; solid state devices; moisture barriers; low friction coatings for tribological applications; protective coatings compatible with body tissues for medical applications; etc.

The literature on diamondlike films includes several hundred publications, most of them appearing after 1980.

The study of diamondlike carbon films is complicated by the ambiguous and inconsistent nomenclature which has been used in research on these films. These films are referred to as "diamondlike films", "hard carbonaceous films", "hard carbon", "a-C:H", and "i-C". In the past, different names have been used to describe materials which are very similar while at other times the same name was applied to very different materials. This confusion is also related to the sometimes overlooked fact that the field of carbon films covers several pure phases of carbon as well as hydrocarbon compounds. The two best known crystalline phases of carbon are graphite, the stable hexagonal form, and diamond, the metastable cubic form. Diamond is stable at very high temperatures and pressures. In the past two decades three additional metastable carbon phases have been discovered: Lonsdalite (also known as hexagonal diamond); Chaoite (a hexagonal high pressure carbon phase); and, two other cubic, high pressure phases of carbon. Present data on the properties of the carbon phases refers to either cubic diamond or graphite. Very little information is available on the properties of the other phases.

For the purposes of this disclosure, the term "diamond" will be used to refer to a pure carbon material wherein the carbon atoms have $sp^3$ hybridization. The term "diamondlike" refers to any carbon deposit having a mixture of $sp^2$ and $sp^3$ hybridized bonds. The fraction of carbon atoms in a particular hybridization state may vary over a wide range. The process of the present invention may be used to deposit diamondlike (as opposed to diamond) films by employing a C+ ion beam of very low kinetic energy (less than about 20 eV). Alternatively, the substrate temperature may be adjusted to favor the formation of a diamondlike film. In general, elevated substrate temperatures favor the production of diamondlike rather than diamond films. The particular temperature chosen will depend on the substrate to be coated. For example, at a substrate temperature of 350° C. a low energy, mass-selected C+ ion beam will not form a diamond film on a nickel substrate (see FIG. 11). In contrast, such a beam will form a diamond film on a gold substrate maintained at 600° C.

The properties of the different phases of carbon appear to be strongly related to the nature of the carbon bond or the electronic structure of the carbon. Cubic diamond has an $sp^3$ tetrahedral structure wherein each carbon atom is bonded to four different carbon atoms and no "dangling bonds" exist. In contrast, graphite has an $sp^2$ structure wherein each carbon atom is bonded to only three carbon atoms in a two-dimensional arrangement where the remaining p-type orbital forms a "dangling bond" (or $\pi$ electron band). "Amorphous carbon" refers to a carbon matrix that includes any possible mixture of $sp^1$, $sp^2$, or $sp^3$ hybridized carbons, and has no crystalline long range order. The term "diamondlike" or "diamond" coating should be reserved for films that possess a true $sp^3$ electronic configuration. The term "i-C" refers to films prepared using ions. The term "a-C" refers to amorphous carbon while "a-C:H" refers to a hydrocarbon material wherein the hydrogen content varies between about 10% to about 70%. In the latter, the hydrogen-carbon bond can result in an $sp^3$ structure similar to that of diamond with the exception that a C—H bond terminates the three-dimensional diamond lattice, thus weakening the structure. The marked variation in the properties of different carbon films thus reflects the nature of localized hybridization, which can range from being graphiticlike to diamondlike.

Graphite is the stable phase of carbon under ambient conditions. Deposition of carbon on various surfaces using thermal carbon species thus results in the formation of either graphitic or amorphous carbon films. Such films have a high electrical conductivity and a high absorption coefficient in both the visible and infrared portions of the spectrum. The metastable nature of the diamond phase requires very high pressures and temperatures for formation. Since this pressure/temperature working region is impractical for routine thin film applications, two basic approaches have been adopted for diamond film fabrication:

(a) energetic atomic species (about 10 to 1000 eV) are used for the creation of localized (about 20 Å) high temperature/high pressure regions called "thermal spikes" in the developing carbon layer. The energetic species can be an ionized or neutral atom or a carbon-containing molecule (no additional thermal carbon needed) or any other ion (e.g., Ar+) that is impinging on the evolving film simultaneously with thermal carbon species: and, (b) chemical reactions involving hydrocarbons (e.g., methane) and hydrogen at elevated temperatures that result in the formation of diamond layers.

Tailoring the properties of such films to fit specific applications is sometimes accomplished by annealing the films during or after deposition using laser radiation, energetic ions (about 10 to 1000 keV), etc.

The oldest approach for diamondlike film deposition involves the use of a beam of low energy carbon ions impinging on a substrate surface with a resultant deposition of carbon. Carbon ions and atoms are typically produced by Ar+ sputtering of carbon electrodes within a magnetically confined plasma operated at a pressure of about 20 to 50 millitorr. The carbon atoms may be further ionized in the same plasma environment. In such systems, the C+ and Ar+ ions are introduced into a deposition chamber maintained at about $10^{-4}$ to $10^{-6}$ torr and accelerated towards the sample to energies in the range of about 50 to 100 eV.

Ion beam deposition techniques can be divided into several subcategories:

(a) primary ion beam deposition techniques wherein carbon/hydrocarbon atoms are generated, extracted, provided with a controlled amount of energy, and directed onto the substrate. The carbon/hydrocarbon ions can be mass-selected. The carbon ions in these systems are used for both the carbon supply needed for film formation and the energy source for the "thermal spikes" needed for diamond structure formation;

(b) ion beam sputtering deposition techniques wherein an energetic ion beam (usually inert gas ion beam) is directed onto a graphite target and the resulting sputtered carbon atoms and ions deposited on the substrate. The energy distribution of these carbon species depends on the nature of the primary ion beam, the ion energy, and the angle of incidence; and, (c) dual ion-beam techniques wherein, in addition to the carbon flux of either (a) or (b) above, a second inert reactive ion beam simultaneously impinges on the substrate to be coated. The carbon flux can consist of either energetic or thermal species since "thermal spikes" are generated by the additional ion beam. The complementary ion beam increases the "diamondlike" constituent of the films by preferential sputtering of the graphitic/amorphous carbon regions.

Different ion beam deposition systems differ markedly in intrinsic position parameters such as the nature and energy distribution of carbon species, beam flux density, ambient pressure during deposition, and composition of non-carbon species in the impinging flux. The significance of some of these deposition parameters for diamondlike film formation is discussed below.

Various plasma deposition techniques have also been used to produce diamondlike films. Plasma decomposition of various hydrocarbon gases results in the deposition of carbon films on substrates placed on a negatively biased electrode. Radio frequency, DC and pulsed plasma systems have been used. Several process parameters related to this technique can be varied and controlled, such as the type of hydrocarbon gas, plasma decomposition power, and substrate bias. Often, an argon/hydrocarbon gas mixture is used, resulting in Ar+ bombardment of the evolving film that preferentially sputters and partially removes the graphitic and amorphous carbon constituents of the film. A relatively high hydrogen content is typical for these techniques.

Chemical vapor deposition (CVD) processes have also been used to produce diamondlike carbon films. The basic principle of CVD diamond film formation is the use of chemically active hydrocarbon fragments (ions and radicals) for the spontaneous growth of diamondlike material under rather metastable conditions. In a typical experiment, a mixture of methane and hydrogen gas (about 1% methane) is introduced into the system and hydrocarbon fragments, atomic hydrogen, and carbon species are generated using an excitation source (hot filament, radio frequency or microwave plasma). Diamond films are deposited on substrates maintained at a temperature in the range of about 100°–1000° C. Such diamond film formation is strongly dependent on the methane concentration and the substrate temperature. The use of methane is very common, but other hydrocarbons have been successfully used, sometimes resulting in a higher deposition rate. The true crystalline diamond structure of CVD films is now well established.

Discussed below are the parameters related to carbon deposition. This discussion is independent of specific deposition techniques and is presented in terms of the influence of the parameters on the growth and final form of the carbon film.

Nature of Impinging Parent Species

A large variety of impinging parent species can be used, including carbon ions (both positive and negative) and carbon atoms, different hydrocarbon radicals and ions, and carbon clusters along with non-carbon species such as hydrogen and argon. The nature of the parent species influences the flux of the impinging carbon and the sticking probability, thereby affecting the deposition rate. The nature of the species used may also affect the properties and structures of the as-deposited carbon films. Films formed by hydrocarbon discharge systems typically have a large hydrogen content (H/C atomic ratio can vary from several percent to 100 percent). The exact composition of the flux which impinges on the substrate, even within a very narrow concentration range, can be crucial for the formation of diamondlike films with specific properties. Some CVD processes, for example, use methane/hydrogen mixtures where the methane concentration is in the range of about 0.3 to 2%. A methane concentration change even in this limited range has been found to strongly influence the film evolution.

The mechanisms involved in the formation of diamondlike films are not well understood. Three different species that may play an important role in these processes (in addition so carbon) are thought to be hydrogen, hydrocarbons, and argon. Hydrogen is believed to be important for two distinct purposes: (a) stabilization of carbon $sp^3$ bonds and saturation of "dangling bonds" (by atomic hydrogen); and, (b) selective etching of graphitic and amorphous carbon domains by the formation of hydrocarbons that evolve from the films. Hydrocarbons appear to be essential for the formation of diamond in CVD processes where the diamond metastable phase is formed by chemical reactions associated with hydrocarbon radicals. Argon ions are believed to etch the non-diamond constituents of the growing films due to their high sputtering efficiency for graphite and amorphous carbon compared to diamond. In most practical systems, measurement and control of the composition of the parent incidence species are difficult. This results in an irreproducibility of the process and a consequent spread in the properties of the as-deposited films.

Ion Energy

Ion energy is a very important parameter for diamondlike film deposition in most techniques, with the possible exception of CVD processes. Ion energy may affect the film evolution in several ways:

(a) In the initial stage it can force the formation of metastable phases (e.g., of carbidic nature) that can contribute to better adhesion between the film and the substrate.

(b) The ion energy is responsible for the "thermal spikes" in the film that are essential for the formation of metastable carbon phases. A minimal ion energy on the order of several eV may be necessary.

(c) ion energies of several tens of eV and above (depending upon the parent species involved and the angle of incidence) are necessary for preferential sputtering of graphic domains and for increasing the percentage of $sp^3$ hybridized carbon in the final product. The self-sputtering of the film by energetic carbon ions may be a limiting factor in achieving high deposition rates, for at high ion energies the sputtering rate can exceed the deposition rate. Another beneficial effect of the preferential sputtering is the possible removal of surface impurities.

(d) Ions with energies of several hundreds of eV and above (depending upon the parent species involved) can damage the evolving structure by creating atomic displacements, thereby destroying the $sp^3$ nature of the deposit. Elevated deposition temperatures (approximately 400°–700° C.) can, however, anneal the damage resulting with diamond formation.

(e) Ions with energies of one keV and above are implanted into the film. Under appropriate conditions that allow annealing of defects, internal growth of diamond occurs. In many practical systems, the energy distribution of the species used for deposition is very broad and uncontrolled, resulting in irreproducibility of the final product.

Another important factor is the concentration depth profile and damage depth profile of the impinging ions or neutral atoms, especially at the higher energies. These profiles are usually nonuniform with a Gaussian shape having a maximum with a depth determined by the nature of the parent ions, the nature of the substrate, and the ion energy. Films having properties which vary as a function of depth can thus be formed.

Incident Carbon Flux

The effect of the incident carbon flux on the final properties of the film is not well understood, although it has been established that the flux is one of the dominant parameters that control the structure and properties of films in general. For example, the power of radio frequency plasma sources has been found to have a strong effect on the optical properties of carbon films (e.g., absorption coefficient or energy bandgap) which could be attributed to a flux effect. It has also been reported that the flux markedly changes the temperature range where diamond is formed during $C^+$ ion implantation. Apart from the influence of the flux on the growth mechanism and the final microstructure of the films (a phenomenon generally observed in thin film technology), it can also be associated with secondary effects that may influence the final properties of the carbon films, such as: (a) increasing substrate temperature; (b) increasing ambient pressure; (c) increasing charging effects when ions impinge on an insulating substrate; (d) producing multiple collision effects in energetic particle bombardment; and, (e) increasing the ratio between the impinging carbon flux and the ambient gas pressure, thus reducing the concentration of trapped impurities in the carbon film.

Nature of the Substrate

The properties of the substrate strongly influence the carbon film evolution, a well-known phenomenon in thin film technology. The substrate material may affect the carbon film in different ways. Materials forming stable carbides are more likely to form strongly adhering films and usually have a high sticking probability for carbon particles, the carbide serving as an intermediate layer between the substrate and the final film. The carbon/carbide solubility in the substrate should also be considered since energetic carbon species can diffuse into the substrate instead of forming a stable carbon surface layer. The match between substrate lattice and diamond lattice is important if epitaxial growth is considered. Diamond films have been successfully grown on diamond seeds, using several deposition techniques. Nickel (111) has a lattice constant similar to that of diamond and has been used for achieving epitaxy. The crystalline size and orientation of the substrate is another parameter that determines epitaxial growth. Correlations between the diamond lattice and the substrate orientation have been found, for example, in the case of CVD deposition on Si(100) substrates. Surface roughness can also affect the crystalline growth of diamondlike films, scratches serving as nucleation sites for the formation of crystals. Diamondlike films have been successfully prepared on different materials with different substrate features, including smooth and rough, single/polycrystalline and amorphous. An additional substrate factor that should be considered is the cleanliness of the substrate surface. In many systems, sputtering and annealing of the substrate surface can be performed in order to achieve a clean surface prior to carbon deposition.

Substrate Temperature

Successful ion beam and plasma depositions of diamondlike films have been carried out at room temperature and lower temperatures (liquid nitrogen). In contrast, CVD processes typically need a reaction temperature of about 800°–1000° C. Attempts to produce such films at temperatures higher than about 100° C. have, in some cases, failed. It appears that in these cases the sticking coefficient of carbon species on surfaces having an elevated temperature was small. The temperature-dependent condensation rate effect for nucleation of plasma polymerized hydrocarbon films has been given as a possible explanation for this observation. Another effect that can prevent diamondlike film formation at elevated temperatures is the diffusion of carbon into the substrate. Such an effect has been observed for carbon films deposited on Ni(111) and subsequently annealed to temperatures higher than 400° C. If the deposition rate is lower than the diffusion rate, film formation does not occur. The formation of gaseous carbon compounds at elevated substrate temperatures is plausible for hydrocarbon deposition or dual carbon/hydrogen deposition, but is unlikely for ion beam deposition where no hydrocarbons or hydrogen is present. The formation at elevated temperatures of graphitic deposits that are removed by energetic particle sputtering is a more reasonable explanation for the last-mentioned system.

Deposition on substrates heated to about 300° C. and above have resulted, in some cases, in the formation of graphiticlike films as revealed by low electrical resistivities (about 100 to 0.1 ohm-cm) and a decrease in hardness compared to films deposited on similar substrates at lower temperatures. For either low energy $C^+$ deposition on diamond or high energy $C^+$ implantation into diamond followed by internal diamond growth, temperatures in the range of about 400°–700° C. were needed for diamond formation.

As mentioned previously, CVD diamond films, in contrast to ion beam and plasma deposited films, require a substrate temperature of about 800°–1000° C. This may result in formation of a thick carbide layer between the substrate and the diamond film due to the high diffusion rates at such elevated temperatures. Such conditions may therefore eliminate many possible applications where thick interface layers or high temperatures are intolerable.

Ambient Pressure

The typical pressure in most deposition systems for diamond or diamondlike films is $10^{-6}$ torr or higher. Comparatively high partial pressures of gases like hydrogen, argon, and hydrocarbons are sometimes an essential element for the deposition scheme. Some researchers are of the opinion that diamondlike film formation is not dependent on the gas pressure; however, this remains to be proven. In many cases comparatively high oxygen and nitrogen concentrations are found in the films, which may affect some of their properties. Uncontrolled vacuum conditions may be one of the reasons for the poor reproducibility of many diamondlike deposition systems.

The role of the partial pressure of molecular hydrogen in the stabilization of diamond $sp^3$ bonds in diamondlike films is also questionable. It is well-known that atomic hydrogen does play a role in the stabilization of real diamond surfaces. However, very high temperatures (about 100° C. and above) or an auxiliary power source is needed for atomic hydrogen formation, in addition to sufficient $H_2$ pressure. Another beneficial effect of atomic hydrogen is the selective etching of graphitic domains resulting in a high percentage of diamond. Hydrogen is several orders of magnitude more efficient in graphite removal than in diamond removal.

The technique of chemical vapor deposition (CVD) has perhaps been the most widely attempted method for the deposition of diamond films on substrates. In chemical vapor deposition, a hydrocarbon is pyrolyzed by heat or radiation to an ionized gas/electron mixture which is allowed to deposit on an exposed substrate. To inhibit the formation of the graphite form of carbon in the deposited film, hydrogen or a hydrogen plasma is typically added to the hydrocarbon before it is decomposed. The resulting diamond films are typically diamondlike, rather than true diamond, and contain an undesirable content of hydrogen.

In ion beam deposition techniques, a substrate is bombarded by high velocity ions. Again, films reported to have been deposited by such techniques are diamondlike rather than true diamond films.

Experiments with low energy reactive ion bombardment of surfaces using ions of carbon, nitrogen, and oxygen have shown that both the gaseous reaction products and the surface film growth and properties are very sensitive to the energy and momentum of the impinging beam species. Solid state phases in the surface region that are far from thermodynamic equilibrium, such as unusual metastable structures, can be formed due to the condition of high available activation energy which is rapidly quenched by the solid. An example of this phenomenon is the production of insulating carbon films by a variety of plasma and ion beam techniques. These carbon-based films have been shown to be mechanically hard, chemically resistant, and optically transparent, while having a resistivity, refractive index, lattice constant, dielectric constant, optical absorption edge, and valence-band structure similar to that of diamond. Hence, the appellation "diamondlike" films has developed, even though the properties of these films can vary considerably depending on the method used for their production. The growth mechanism and optimum conditions for obtaining "diamondlike" properties for such films are of obvious interest.

ion beam deposited carbon films are in metastable amorphous or quasi amorphous states whose relative stability and physical properties may be strongly dependent upon incorporation of constituents like hydrogen, oxygen, etc. within the structure.

The techniques of the prior art have failed to provide a strongly adhered (preferably chemically bonded), pure carbon film on a substrate article which has a true diamond composition or which closely approximates the microstructure and physical properties of true diamond.

The ability to reproducibly form thin carbon films with a diamond structure has important technological applications, not only because of the strength and hardness of diamond, but because it has an extremely low electrical conductivity (i.e., it is an excellent electrical insulator) and has the highest thermal conductivity of all known substances (i.e., it is an excellent heat conductor). These properties stem from the strong, rigid, symmetrical tetrahedral bonding between carbon atoms. This bonding produces an extremely elastic lattice with low phonon amplitudes, that is, the thermal motions have limited amplitude; as a result, the diamond allotrope of carbon has the lowest specific heat of all elements and high heat transfer rates.

SUMMARY OF THE INVENTION

In the process of the present invention, low energy (about 10 to 300 eV), mass-selected, $C^+$ ion beams are used to deposit thin carbon films on selected surfaces in an environment maintained at less than $10^{-8}$ torr at room temperature. The resulting films may be characterized by Auger electron spectroscopy (AES), x-ray and UV photoelectron spectroscopy (XPS and UPS), valence level electron energy loss spectroscopy (ELS), K-shell ionization loss spectroscopy (ILS), and ellipsometry.

It has been found that for surfaces of silicon (100), nickel (111), tantalum, tungsten, and gold, the initial monolayer of the deposited film is in the form of a carbide layer which is chemically bonded to the substrate atoms. The film evolves gradually over the next several layers deposited, through intermediate structures, into a diamondlike structure. The diamondlike structure of the outer layers of such a film may be confirmed by comparing the results of the above-mentioned spectroscopic measurements with those of pure diamond and graphite and by performing band structure calculations.

The films produced by the process are generally free of impurities, inert to $O_2$ chemisorption, structurally stable up to 350° C., have a low sputtering yield, and have a sharp interface with the substrate surface.

It has been found that films having an Auger spectrum corresponding to a diamondlike structure are obtained only for certain combinations of ion energy and dose and that outside of the range, other carbon forms prevail.

The process is practiced with a low-energy, mass-selected, active-ion beam in an apparatus which provides for efficient differential pumping in order to maintain a clean target surface. In situ techniques for analysis of the reaction products allow the growth mechanism to be observed and optimum conditions for obtaining diamondlike properties for such films to be determined.

In one embodiment, the process utilizes an apparatus wherein $C^+$ ions are generated by electron impact of CO gas and are extracted from the ion source region at the potential of interest, accelerated to high energy, mass-selected to pass $^{12}C^+$, and transported through a long flight tube designed to eliminate fast neutrals. The ions are decelerated just prior to impact with the substrate (target). It is easier to transport and focus a high-energy beam. When decelerated, ion beams tend to diverge. Hence, the deceleration is most preferably positioned as close as possible to the substrate (e.g., on the order of a few millimeters). The efficient differential pumping of the beam line allows maintenance of the system pressure in below $10^{-8}$ torr during exposure of the substrate to the $C^+$ ions. In a typical experiment using such an apparatus, the $C^+$ beam currents are in the range of 10 to 1000 nA and a produce spot size of 0.12 cm$^2$ with an energy spread of 1 eV. The sample target (substrate) may be, for example, a single crystal of nickel with a polished (111) surface cleaned by 3-keV $Ar^+$ sputtering and electron-beam annealing to 900° C. before each experiment.

Carbon films with a diamond or diamondlike structure that are chemically bonded to surfaces can be deposited by means of low-energy $C_m^+$ ion beams according to the process of the invention. When mass-selected $C_n^+$ beams at energies in the range of from about 20 to 200 electron volts impinge on an atomically clean surface, the first carbon monolayer grows as a carbide structure that is chemically bonded to the surface. As deposition continues, the structure evolves over the next several atomic layers into a diamondlike structure. These pure carbon films are strongly adhered to the surface through the carbide bonds, which also provide for an intimate interface. The nature of the carbon deposit and the evolution of the film can be intimately followed by means of the carbon Auger lineshape. These lineshapes serve as a fingerprint of the chemical environment.

The deposition apparatus may include multiple ion beam lines for the simultaneous deposition of different constituents. The beams may be focused to one spot on the substrate for simultaneous deposition of films composed of different constituents or for doping a film with very low concentrations of foreign atoms.

BRIEF DESCRIPTION OF THE DRAWINGS

FIG. 3 is a top view schematic drawing of a multibeam apparatus suitable for the practice of the process of the present invention. The apparatus illustrated comprises dual ion beams and a deposition chamber equipped with provisions for in situ surface analysis techniques. An apparatus of this type permits the simultaneous deposition of two different species on a substrate article.

DETAILED DESCRIPTION AND PREFERRED EMBODIMENT

Figure 1:
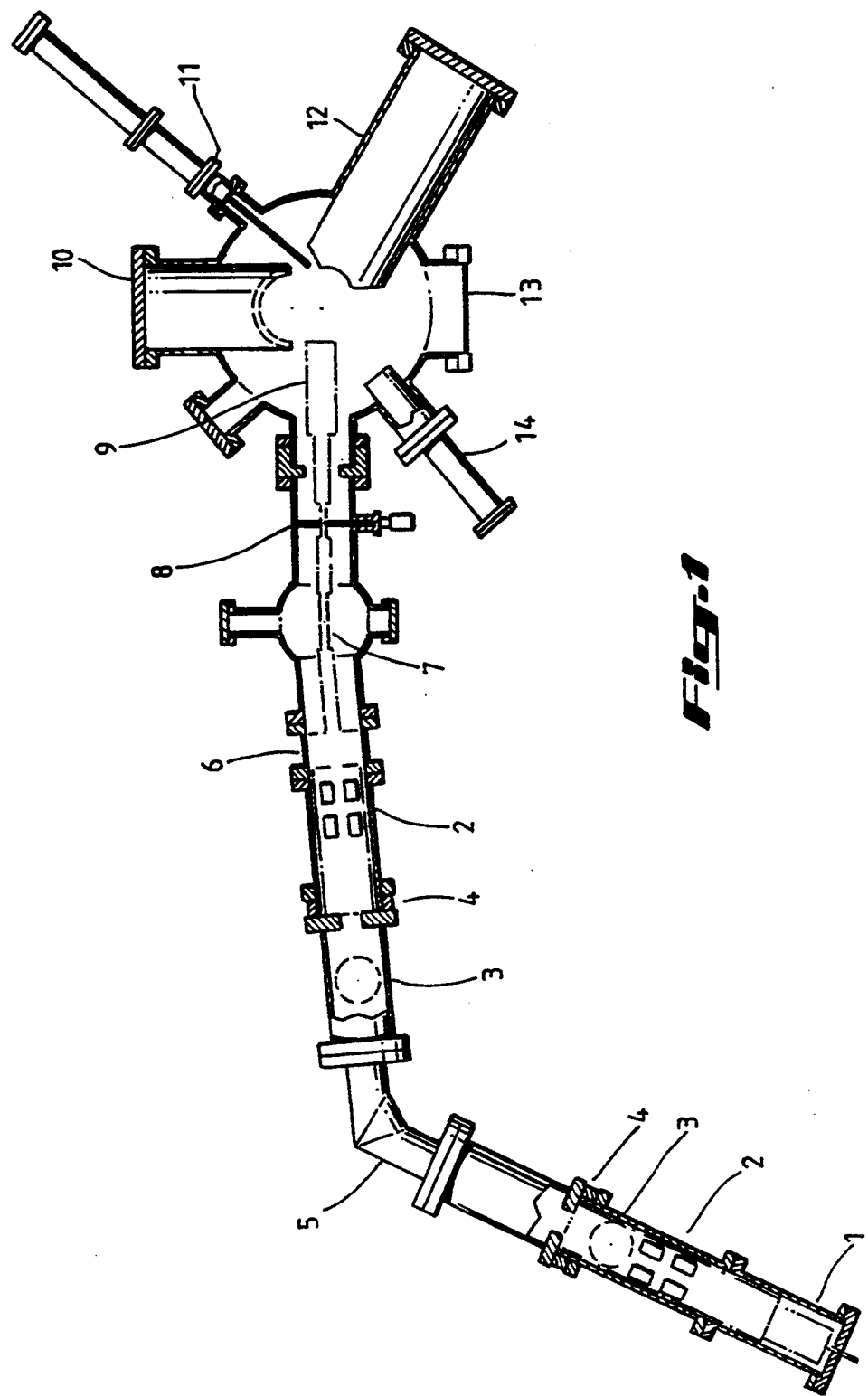
FIG. 1 is a top view schematic drawing of an ion beam deposition apparatus which has been used to develop and practice the process of the present invention.

An apparatus suitable for practice of the process of the present invention includes a source of low energy (about 100 to 300 eV) carbon ions with a beam line for mass and energy selection and elimination of fast neutrals and a deposition chamber which can be maintained under pressure conditions less than $10^{-8}$ torr during deposition. The apparatus used in the discovery of this invention included a deposition chamber which also functions as an analysis chamber for in situ spectroscopic investigation of the deposited films. Although convenient, provision for such analytical tools would not be necessary in a production apparatus.

The method of the present invention is a deposition process which features accurate control of the energy of the impinging ions. Variation of the beam velocity is an attribute and works as follows. Relatively low energy (about 1 to 75 eV) ions can be used to deposit the initial three to four layers. The gas phase species have the highest sticking or reacting coefficients at such energies. Additional overlayers may then be deposited at energies greater than about 75 eV where higher beam currents can be achieved and the higher energies permit good atomic mixing in the layers. Such a process can allow for self-annealing of intrinsic growth defects.

In one particular apparatus used to practice the present invention, the ions are accelerated, mass analyzed, and energy selected, while they travel through four stages of differential pumping and a neutral stop. Deceleration occurs immediately before the ions impinge on the target sample. $C^+$ beam currents used were in the range of 10 to 100 nA in a spot size of 0.12 cm² with an energy spread of 2 to 3 eV; these currents were stable to within 10% ever a period of 3 to 4 hours. The deposition chamber consisted of a 14-inch bell jar with the sample to be coated mounted in the center of the bell jar on a movable sample holder. The system was equipped with a Perkin-Elmer double pass cylindrical mirror analyzer for AES, UPS, and XPS and hemispherical grid LEED optics. Prior to carbon deposition the substrate was cleaned by repeated cycles of inert gas sputtering and annealing until AES measurements revealed less than one percent of contaminant CO. Deposition of carbon was interrupted periodically, by closing a gate valve in the beam line, in order to carry out spectroscopic measurements at intermediate ion doses. The dose and energy calibration procedures used are described by Kang et al. in *J. Chem. Phys.* 88, 5882 (1988), the teachings of which are incorporated herein by reference.

The substrate surface was cleaned in situ by $Ar^+$ bombardment (10 μA/cm²) and by annealing to high temperatures (approximately 800° C.) prior to deposition. The apparatus employed includes provisions for in situ surface spectroscopic techniques such as x-ray and ultraviolet photoelectron spectroscopy (XPS and UPS), Auger electron spectroscopy (AES), and electron energy loss spectroscopy (ELS), as well as spectroscopic ellipsometry for characterization of the deposit.

Figure 2:
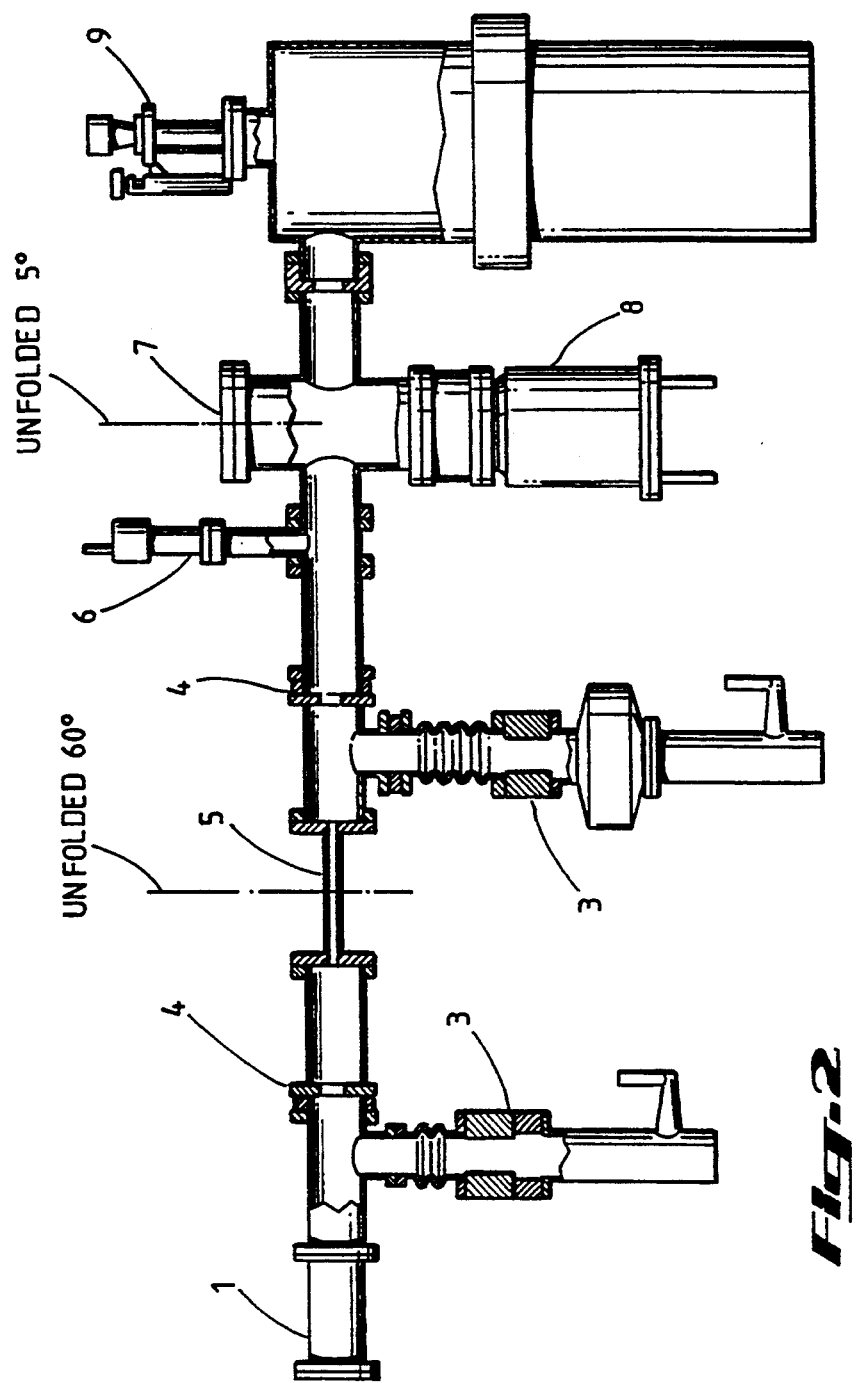
FIG. 2 is an unfolded side view schematic drawing of the ion beam deposition apparatus shown in FIG. 1.

An apparatus suitable for the practice of the process is shown schematically in FIGS. 1 and 2. The illustrated apparatus comprises an ion accelerator attached to a surface analysis chamber. Important features of the system are a relatively low-energy ion beam that is mass-selected and has a narrow energy spread; efficient differential pumping to keep the source gas out of the collision chamber; and, an ultrahigh vacuum (UHV) collision chamber with means for positioning and cleaning the substrate article to be coated (e.g., by sputtering and annealing). Also illustrated as a part of the apparatus are the devices for the in situ analytical techniques used for characterizing the surface produced by operation of the apparatus.

FIG. 2 is a schematic drawing in side view of the ion beam deposition apparatus shown in FIG. 1. The components comprising the deposition apparatus of FIGS. 1 and 2 are: an ion source and gas inlet 1; electrostatic quadrupole doublets 2; vacuum pumping port 3; ceramic isolator for flight tube 4; a 60-degree sector electromagnet 5; a gate valve 6; 6-degree deflector plates (for the elimination of fast neutrals); and turbomolecular pumping stage 7; rotatable flap serving as a differential pumping baffle and beam aperture 8; accelerator lens 9; LEED/AES hemispherical grid analyzer 10; HeI/HeII UPS source 11; CMA analyzer 12; view port 13; and residual gas analyzer (RGA) mass spectrometer 14.

For time-of-flight (TOF) scattering and recoil measurements in this apparatus, LEED/AES analyzer 10 may be replaced by a mass spectrometer/TOF drift tube and RGA mass spectrometer 14 may be replaced by a pulsed mass-selected rare gas ion scattering source. The x-ray source for XPS is located above the UV source out of the plane of the view illustrated. An electron gun for AES is on the CMA axis.

The surface analysis chamber of the illustrated apparatus is a 14-inch stainless steel bell jar. It contains a cylindrical mirror analyzer (CMA) with x-ray and UV sources for photoelectron spectroscopy (XPS and UPS) and an electron gun for Auger electron spectroscopy (AES), a 180-degree hemispherical retarding grid for low energy electron diffraction (LED), and a quadrupole mass spectrometer. In order to perform time-of-flight (TOF) ion scattering and direct recoiling, the mass spectrometer/TOE drift tube may be placed in the position of the LEED optics and a pulsed mass-selected rare gas ion source placed in the position of the RGA mass spectrometer. This provides a scattering and recoiling angle of 30 degrees and a flight path of 32.5 cm.

The deposition chamber in the illustrated apparatus is pumped by means of a 500 liter per second turbomolecular pump, a 250 liter per second ion pump, and a titanium sublimation pump with a liquid nitrogen cooled cryobaffle. The resulting base pressure in the deposition chamber of the illustrated apparatus is $3 \times 10^{-11}$ torr. It is preferable that the deposition chamber be maintained at a pressure of about $10^{-8}$ torr or less during deposition of a carbon film on an atomically clean substrate surface. If a pressure greater than about $10^{-8}$ torr is permitted to develop in the deposition chamber, the substrate surface will likely be contaminated with a monolayer or multiple layers of oxygen, hydrogen, water vapor, carbon monoxide, or other residual gas components which interfere with, and perhaps even altogether preclude, the formation of a base carbide-bonded carbon layer on the substrate surface by 12 C+ ion beam bombardment. Moreover, if pressures greater than about $10^{-8}$ torr develop in the deposition chamber during deposition, the residual gas constituents will likely become incorporated or entrapped within the developing carbon film and will adversely affect the ability to evolve the film into one of a diamond structure.

For the purposes of this disclosure, "atomically clean" as applied to substrate surfaces means that the surface to be coated is substantially free of foreign (i.e., non-substrate) species, particularly carbon and oxygen. If a surface is atomically clean, sensitive surface analytical techniques such as AES will not detect the presence of contaminants such as adsorbed carbon and oxygen. This implies that there exists less than about 0.01 atomic layer (or less than about $10^{13}$ atoms/cm$^2$) of such contaminants on the surface. Many substrates may be treated by sputtering and annealing to provide an atomically clean surface. However, maintenance of such a surface in an atomically clean state requires UHV conditions (approximately $10^{-8}$ torr or better). During deposition of a film at relatively high ion currents, a somewhat higher pressure may suffice (say, $10^{-7}$ torr) if the arrival date of the impinging ion species is substantially greater than the arrival rate of background species on the surface being coated. In this regard, it should be noted that in an experiment wherein the pressure in the deposition chamber was about $10^{-6}$ torr, a C+ ion current of about 1 mA did not exclude oxygen from films deposited on silicon, nickel, and germanium substrates. The oxygen in this films was observed by AES.

The beam line of the apparatus illustrated comprises an ion source, lens transport system, mass analyzer, and decelerator. Construction is of stainless steel with copper-sealed flanges except in the ion source and mass analysis regions where Viton o-rings are used. Four stages (FIG. 2) of differential pumping are used in this apparatus in order to reduce the pressure from about $1 \times 10^{-4}$ torr in the ion source region to a working pressure of about $2 \times 10^{-10}$ torr or below in the deposition chamber.

The source and mass analysis regions are pumped by two separate 325 liter per second oil-trapped diffusion pumps using polyphenylether oil. The entrance and exit apertures of the mass analyzers (each 2 mm wide by 1.5 cm high) serve as differential pumping baffles. The region of the 6-degree bend (FIG. 2) is pumped by means of a 500 liter per second turbomolecular pump and a 3 mm diameter circular aperture which admits the beam into the main chamber.

The low-energy ions are produced by a Colutron ion source with the ionization region maintained at approximately 1 to 300 eV above the sample. The sample is typically grounded, but may, in fact, be biased to any potential so long as appropriate potential differences in the system are maintained. The Colutron ion source is a plasma-type source which produces small size (about 2 mm diameter), intense beams having a narrow energy spread (about 0.1 to 0.2 eV). The ions are extracted from the ionization region by means of a drawout plate. They are then accelerated to about 1500 eV (the fixed energy chosen for mass analysis) by means of a two-tube accelerating lens. In the apparatus illustrated, all the beam components downstream from this lens (with the exception of the decelerator) are maintained at a potential of $-1.5$ kV relative to the target. An electrostatic quadrupole doublet receives the beam from the accelerator lens. The quadrupole doublet projects the beam through the entrance slit of the magnetic analyzer and an identical quadrupole doublet receives the beam after it emerges from the exit slit of the mass analyzer. This component functions as a stigmatic lens which is capable of having different magnifications in two perpendicular planes so that the beam shape can be converted from circular to rectangular (for mass analysis) and then back to circular.

In the apparatus illustrated the mass analyzer is a 60-degree sector electromagnetic for which the M/E species is selected by varying the current through the magnet. The vacuum housing of the mass analyzer is electrically isolated from the rest of the vacuum housing and pumps so that it can be maintained at a potential of about $-1.5$ kV relative to the ion source.

Mass selection of the ion beam may be accomplished by any suitable technique. Magnetic sector analyzers are preferred over quadrupole analyzers since they typically have better focusing and the absence of a straight-through path in such analyzers helps eliminate fast neutrals from the beam. The addition of a deflector plate near the exit of the ion beam apparatus to further exclude fast neutrals is preferred inasmuch as some fast neutrals do pass through the magnetic sector as a result of the relatively higher pressures in that portion of the beam line.

The ion beam emerging from the exit of the mass analyzer is reshaped by the exit quadrupole double lens and then drifts at about 1.5 keV through a parallel plate condenser which bends the beam by about 6 degrees in order to eliminate the line-of-sight neutral beam which also emanates from the mass analyzer. The beam passes the final aperture into the deceleration lens which is located in the deposition chamber close to and in front of the substrate. In this way the ions are decelerated close to the substrate, thereby maximizing the ion current and minimizing space charge dilation. Suitable decelerators are described in Enge, *Rev. Sci. Instrum.* 30, 248 (1959), M. L. Vestal, Ph.D. dissertation University of Utah, 1975, p. 37, and Vestal et al., *Rev. Sci. Instrum.* 47, 15 (1976). The deceleration lens may be operated in either the step-potential or exponential potential gradient retardation mode. The former mode is employed by maintaining all 34 decelerator plates at about 1.5 kV while placing 3 variable plates at the exit end of the lens near ground potential. A Faraday cup (1.32 mm diameter) mounted on the substrate manipulator may be used far monitoring the ion flux, The total beam path length in the apparatus illustrated is 2.4 meters from the source to target, providing long drift times for relaxation of excited species formed in the source. For low-mass ions, this time for relaxation is the sum of the flight time through the beam line (approximately 25 microseconds) and the residence time in the source (estimated to be about 10 to 30 microseconds).

Ion current densities of up to 10 microamps per square centimeter were achieved for a 150 nanoamp beam of which 135 nanoamps were focused into the Faraday cup (0.0137 cm$^2$). This corresponds to approximately $6 \times 10^{13}$ ions per square centimeter per second striking the surface. More typically, 60 nanoamp currents in the Faraday cup were used, giving 3.6 microamps per square centimeter and $2.3 \times 10^{13}$ ions per square centimeter per second. Below 7 eV, the current decreases rapidly, while above this value it increases monotonically. This phenomenon suggests that space-charge expansion below 7 eV is the limiting effect on the final ion current. Transmission through the beam line is independent of the final energy since all voltages are referenced to the potential of the ionization region. When this potential changes, every other voltage changes with it. Thus, when the potential of the ionization region is varied with respect to a grounded substrate (to vary the final beam energy), the velocities, and hence transmission characteristics of the ions in the beam, do not change. All changes with varying beam energy occur in the step potential decelerator.

Approximate current density profiles of the beam were obtained by two methods: (1) scanning the Faraday cup aperture through the beam; and, (2) depositing a reactive species on a surface and using AES to monitor the reacted spot by scanning the surface using the AES electron beam. The beam current is stable over a period of hours to within two percent. Experiments with apertures show that the beam angular divergence is less than one percent before the deceleration region and increases substantially beyond this region up to values less than about six percent.

$C^+$ ion beams can be produced by a variety of ion sources, such as electron impact, plasma, sputtering, and discharge sources. In the apparatus illustrated, the $C^+$ ions are produced by admitting a carbon-containing gas into the discharge region. Preferred ion sources are those which provide a relatively high current with a relatively narrow energy spread. A narrow energy spread is desirable inasmuch as it allows one to use relatively large slits in the magnetic sector to pass a high ion fluence through the mass analyzer. Sputter sources typically produce an ion current with a very broad energy spread. More preferred are duoplasmatron or Freeman-type sources wherein an electron beam is used to ionize a gas. Such sources provide ions with a tight energy spread, typically about $\pm 1$ eV. For the deposition of diamond or diamondlike films beams of $C_n^+$ or $C_n^-$ where n is an integer greater than or equal to one are preferred. Suitable gases for the production of such beams include, but are not limited to carbon monoxide and hydrocarbons, as is well-known in the art. Carbon-containing gases suitable for production of $C^+$ ions include carbon monoxide, carbon dioxide, and hydrocarbons. Carbon monoxide was used in the apparatus illustrated. A typical composition of the ensuing ion flux for a carbon monoxide gas is $CO^+$ (78%), $C^+$ (18%), and $O^+$ (4%). The individual ions are mass-selected by varying the current through the magnetic sector and are focused on the sample target by tuning the electrostatic lens. The substrate particle target is atomically cleaned, preferably by rare gas ion sputtering and electron beam annealing to temperatures just below the substrate's melting point. In the illustrated apparatus, for a nickel substrate, 3 keV $Ar^+$ ions were used and annealing was performed at 900° C. LEED may be used to check the surface structure following this cleaning procedure. Preferably, the deposition chamber is maintained at a pressure of $1 \times 10^{-8}$ torr or less in order to prevent recontamination of the atomically clean substrate surface.

An apparatus suited to the process is, then, a mass-selected ion beam deposition system comprising an ion source, acceleration system for ion beam transport, mass selection capability for the transmission of only the desired species, deceleration system for achieving and controlling the low ion energies needed for diamondlike film deposition, target substrate assembly, and a deposition chamber maintained at low pressure, preferably with facilities for in situ measurements and controlled gas admission.

The apparatus used in the development of this invention is described in Kang et al., *J. Chem. Phys.* 88(9), 5882 (1988). This apparatus provided typical $C^+$ current densities of about 500 nanoamps per square centimeter for a 0.1 square centimeter beam size (for an approximately 100 eV beam). This corresponds to a deposition rate of only 7 Å per hour (assuming a sticking probability of one and a carbon film density of three grams per square centimeter). Such current densities are too low for practical thick film depositions but are ideal for in situ film evolution investigations. The base pressure in the deposition chamber of this apparatus is $3 \times 10^{-11}$ torr while the pressure in the ion source is about $10^{-5}$ torr. The apparatus was fitted with UHV-compatible leak valves for the introduction of additional gases (e.g., hydrogen). This apparatus is a basic research system not well suited for thick film production due to its low current density. The ion current sharply decreases when the ion energy is reduced due to space charge repulsion resulting in beam profile dilation. Specially designed beam configurations are thus needed for the production of intense ion beams at energies in the range of 10 to 100 eV.

A major advantage of mass-selected ion beam deposition is the ability to control all the parameters involved in diamondlike film deposition. These advantages are listed below.

(a) Ion species-different types of carbon-bearing ions can be produced by ion sources (e.g., $C^+$, $C^-$, $C_n^+$, hydrocarbon ions, etc.), and, by mass selection, only one ion type be allowed to impinge on the target.

(b) Dual ion beam deposition of carbon ions and hydrogen/argon ions is possible. Multiple beams can be used to provide for the application of more than one species, e.g., dopants may be implanted in a diamondlike film as it is being deposited.

(c) The ion energy is controlled in any desired range and the ion energy distribution is relatively narrow.

(d) The ion flux can be controlled in a range covering many orders of magnitude (e.g., one nanoamp per square centimeter to one milliamp per square centimeter).

(e) The ion beam size can be controlled. Rastering of microfocused beams for "direct writing" is thus feasible.

(f) Deposition of pure carbon films on atomically clean substrates maintained under UHV conditions (approximately $10^{-10}$ torr) is feasible. Controlled admission of background gases is also possible.

(g) Substrate temperatures can be varied from cryogenic to upwards of 1000° C.

(h) In situ substrate cleaning facilities for annealing and sputtering prior to carbon deposition and in situ diagnostics using surface analysis or other techniques are possible.

(i) Post-deposition annealing without exposing the film to the atmosphere is feasible.

Mass-selected ion beam processes can be used to produce films having "tailored" properties. This can be accomplished by varying the specific deposition parameters which can be supplied by another ion beam deposition technique or by other deposition methods such as CVD or plasma, depending on the specific deposition parameters required.

Drawbacks to mass-selected ion beam deposition include:

(a) The need for a relatively expensive deposition apparatus which includes provisions for ultrahigh vacuum.

(b) Small size of presently available ion beams limits the area that can be coated on a substrate in a reasonable period of time to only a few square centimeters.

(c) Due to space charge limitations, ion current densities are limited, especially when low deposition energies are involved (less than about 100 eV). The maximum deposition rate obtained using the illustrated apparatus is about 3 to 5 Å/sec (1 to 2 micrometers per hour at 100 eV or below). The process has been performed in an apparatus capable of providing ion current densities of about 10 mA/cm$^2$. Such ion current densities are sufficient to deposit a 1-$\mu$m thick film in a period of about 3 hours.

(d) Only line-of-sight deposition is possible. Thus, complex structures cannot be uniformly coated using this technique. CVD or plasma deposition techniques are more suitable for such purposes.

The apparatus shown in FIGS. 1 and 2 was utilized to deposit a carbon based film on a nickel substrate as follows. Briefly, C$^+$ ions generated by electron impact of CO gas were extracted from the ion source region at the potential of interest, accelerated to high energy, mass selected to pass $^{12}$C$^+$, and transported through a long flight tube designed to eliminate fast neutrals. The ions were decelerated just prior to impact with the nickel substrate target. Efficient differential pumping of the beam line allows maintenance of the system pressure in the low 10$^{-10}$ torr range during exposure to the C$^+$ ions. The C$^+$ beam currents were in the range of 10 to 100 nA in a spot size of 0.12 cm$^2$ with an energy spread of about 1 eV. The nickel substrate target was a single crystal of Ni with a polished (111) surface which was cleaned by 3 keV Ar$^+$ sputtering and electron beam annealing to 900° C. before ion bombardment. The techniques of Auger electron spectroscopy (AES), x-ray and UV photoelectron spectroscopy (XPS and UPS), and direct recoil (DR) spectrometry were available in the UHV chamber for sample analysis. The total impurity level (sum of H, C, and O) on the nickel substrate surface after cleaning was <1% of a monolayer as determined by DR spectrometry; AES detected no C or O under these conditions.

In a typical procedure, the ion energy was fixed in the range 10 to 300 eV and a clean Ni surface was irradiated with a C$^+$ flux that was predetermined in a Faraday cup mounted on the substrate holder; with ion currents of 25 nA, 4 to 5 hours irradiation time was required for a dose of 2×10$^{16}$ ions/cm$^2$. The beam was interrupted at fixed dose intervals by closing a gate valve in the beam line and AES spectra were measured in the derivative mode, i.e., dN/dE, by means of a double-pass cylindrical mirror analyzer using a low current (2 $\mu$A) electron beam at 1.6 keV. The highly surface-sensitive DR technique was used to monitor the carbon and the impurity hydrogen and oxygen levels; the impurities were found to be negligible.

Figure 5:
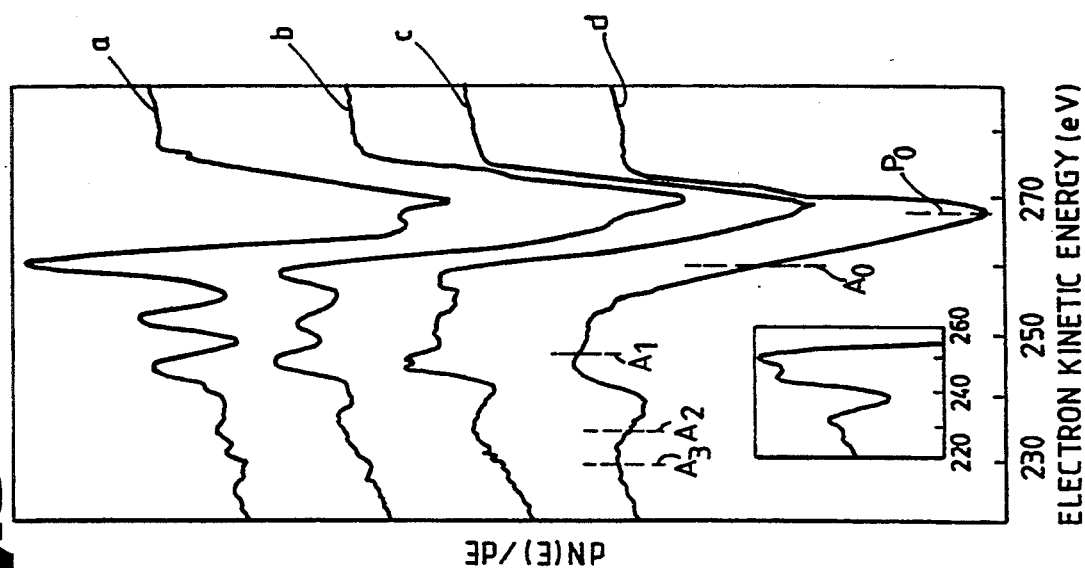
FIG. 5 shows the evolution of the AES lineshape from (a) carbidic to (d) diamond for 75 eV $C^+$ deposition on Ni. The ion doses are: (a) $2.0 \times 10^{15}$; (b) $6 \times 10^{15}$; (c) $9 \times 10^{15}$; and, (d) $> \times 10^{16}$ ions/cm$^2$. Spectra (a)–(c) were referenced according to carbide and graphite spectra of Coad et al., *Surf. Sci.* 25, 609 (1971), while spectrum (d) was referenced to according to the diamond spectrum of Pate, *Surf. Sci.* 165, 83 (1986). The inset shows the C KLL signature of a deposited carbon film on Ni(111) obtained with minimal exposure to the electron beam. This is precisely the KLL signature of single crystal diamond.

The evolution of the C KLL Auger lineshape as a function of 75 eV C$^+$ dose on Ni(111) is shown in FIG. 5; in order to minimize electron beam damage processes, a low current (1 microamp) and low energy (1610 eV) electron beam was used for excitation. For initial low C$^+$ doses in the range of about 2 to 3×10$^{15}$ ions/cm$^2$, the lineshape (FIG. 5a) corresponds to that of a carbide (Ni$_n$C). The deposit is approximately one monolayer thick at this stage. FIG. 5b shows the C lineshape corresponding to an ion dose of about 6 to 8×10$^{15}$ ions/cm$^2$. For ion doses of this order, three-dimensional growth of carbon overlayers can be expected and metal-carbon composite layers must be present. If this is the case, the C Auger signal must be representative of both carbon-carbon and carbon-metal bonds. Indeed, the C lineshape at this dose stage, called structure (b), is identical to that reported by Craig et al., *Surf. Sci.* 124, 591 (1983) for sputtered metal-carbon thin films with intermediate combinations of amorphous carbon and transition metal-carbide lineshapes. This emphasizes the fact that multilayer growth of the films does not affect the metal-carbon bonding at the interface. With additional carbon deposition, structures similar to those shown in FIG. 5c and finally FIG. 5d develop. The AES lineshapes have been compared with previously report spectra of pure diamond and graphite samples. The lineshape of FIG. 5c is similar to that of an sp$^2$ hybridized "graphitic" carbon form, while that of FIG. 5d is the characteristic signature of the sp$^3$ hybridized "diamond" form; both of these allotropes nave broad Auger lineshapes. The inset of FIG. 5 shows the C KLL signature of a deposited carbon film on Ni(111) obtained with minimal exposure to the electron beam; this is precisely the KLL signature of single crystal diamond. Spectral features deteriorate to that of FIG. 5d after only a few minutes of exposure to the electron beam. The results of spectroscopic measurements carried out as a function of C$^+$ energy and dose are discussed at length in Kasi et al., *J. Chem. Phys.* 88, 5914 (1988), the teachings of which are incorporated herein by reference.

The O$_2$ chemisorption and O$^+$ sputtering of the carbon films were tested in situ on structures (a) and (d) of FIG. 5. For chemisorption, the films were exposed to 80 Langmuirs of O$_2$ after which the AES spectrum was monitored. Oxygen was found to chemisorb readily on (a) with a resulting 50% decrease in the carbon AES signal and simultaneous formation of NiO. No chemisorption was detectable on (d) nor was there any noticeable carbon removal. The results of low energy O$^+$ sputtering showed that (a) has a sputtering yield of S=1 even below 10 eV, while (d) has a yield of only a few tenths even at O$^+$ energies of 20 to 30 eV. Preliminary thermal desorption studies show that the (a) type films are completely desorbed below 440° C. while the (d) type films are stable up to temperatures at least 150° C. higher.

These results show that ion beam-deposited carbon films on Ni(111) form an initial reactive carbide layer which evolves continuously with increasing dose of C$^+$ ions into a film with "diamondlike" ASS lineshape which is highly resistant to both O$_2$ chemisorption and O$^+$ sputtering. At the initial low doses, AES indicates that the surface is covered with a dispersed carbide layer in which each carbon atom is bonded directly to the Ni. With increasing dose, the surface C concentration increases and clustering on neighboring C atoms begins to form a continuous film with C—C bonds. These clusters are chemically bound to the surface through several C—Ni bonds. The fact that films with the latter properties have an energy and dose dependence indicates that the energy of the incoming C+ ions is important to the mechanism of film growth and resulting structure and properties of the film.

Carbide bonded diamond films can be deposited by the method of the invention on a wide variety of substrate materials. Any solid nonvolatile elemental substance that can be prepared to have an atomically clean surface may be used as a substrate. Especially suitable substrate materials are those known to form stable carbide compositions, such as Al, Ba, Ca, Fe, Mn, Mo, Ni, Si, Sr, Ta, Th, Ti, W, V, and Zr. Carbide bonded diamond films have also been successfully applied to elemental substrates which are not otherwise known to form stable carbides. Hence, by practice of this invention a carbide bonded diamond film has been formed on a gold substrate article. Hence, it is contemplated that Cr, Co, Cu, Pb, Mg, Pd, Pt, Sn and Zn are suitable substrate materials for acceptance of a carbide bonded diamond film by deposit according to the method of this invention. Substrates suitable for film deposition by the method of this invention may also be multielement mixture, alloys or compositions.

By employing the method of the invention, carbide bonded diamond films have been formed on each of the following substrate materials: nickel, silicon, gold, tantalum, and tungsten. Measurements on the carbon films so deposited indicate that they are identical and independent of the substrate upon which they are deposited. Carbide bonding to the substrate has been unambiguously identified for all five substrates. The characteristics of the deposited films, independent of the specific substrate upon which they reside, are discussed immediately below. A more thorough discussion may be found in Kasi et al., *J. Chem. Phys.* 88, 5914 (1988).

Auger Spectral Characteristics—The Auger electron spectroscopic (AES) results have been presented in FIG. 5 and these results have been discussed. Summarizing these results, the first atomic layer deposited has the AES lineshape of a true carbide compound. The lineshape evolves with increasing beam dose over the next several atomic layers deposited into that of true diamond.

Ellipsometry Measurements—Ellipsometry measurement at a wavelength of 6300 Å and at several different angles and directions along the crystal provided a refractive index in the range 2.25 to 2.57; that of pure diamond is 2.41. The scatter in the data results from nonuniform film thicknesses due to the small size of the deposited film relative to the ellipsometer photon beam.

Figure 6:
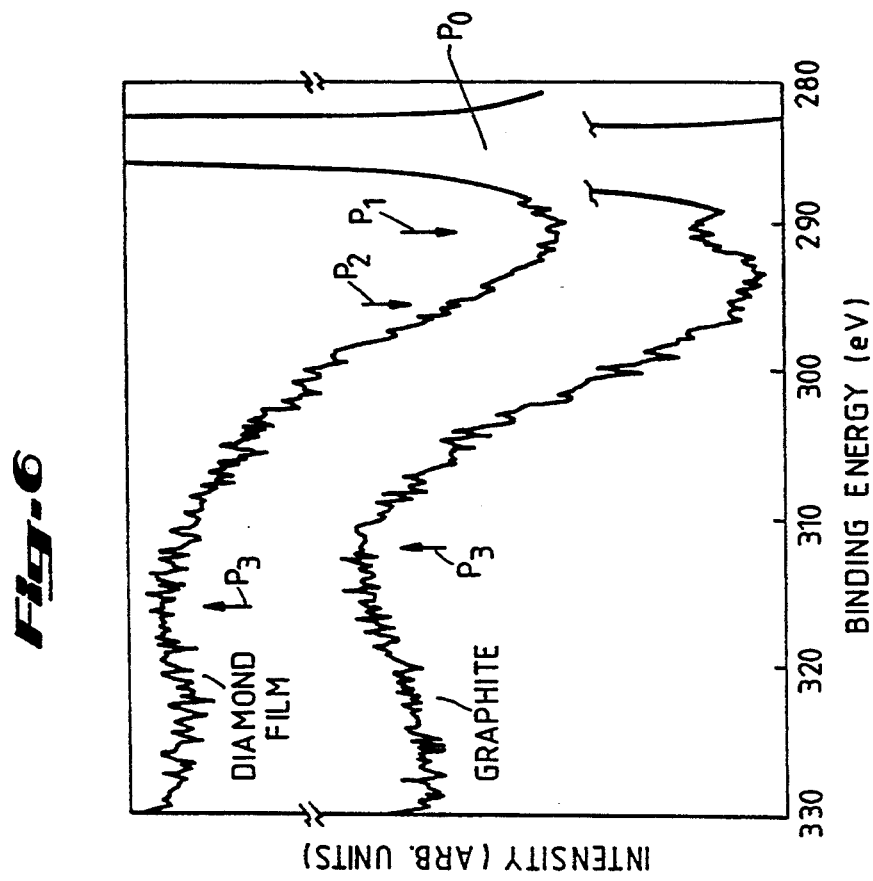
FIG. 6 shows x-ray photoelectron spectra (XPS) of the C 1s line and characteristic energy loss features for graphite and a deposited diamond film on Ni(111).

X-ray Photoelectron Spectroscopy (XPS)—Results from XPS measurements using Mg $\underline{K\alpha}$ x-rays are shown in FIG. 6 for a diamond film deposited on a Ni(111) substrate. AES had previously been used on this film to show that it had the diamond lineshape. The XPS spectrum of a freshly cleaved graphite sample, measured in the same spectrometer system, is also shown in FIG. 6 for comparison to the diamond film. The carbon 1s spectra and characteristic energy loss features of graphite and a diamond film sample are shown in FIG. 6.

The carbon energy loss features of FIG. 6 have been labelled $P_i$ according to the spectra for pure diamond and graphite as published by F. R. McFeely, S. P. Kowalczyk, L. Ley, R. G. Cavell, R. A. Pollak, and D. A. Shirley, *Phys. Rev.* B9, 5268 (1974). The energy position of the various features for the published spectra are listed in Table II of the McFeely et al. publication. The XPS spectra of the diamond film deposited by the method of the invention is in agreement with the published XPS spectrum of pure diamond and different from graphite in the following ways:

(a) Graphite, glassy carbon, and microcrystalline graphite exhibit a feature labelled $P_1$ at 5 to 6 eV above the main C 1s peak labelled $P_0$. This 5 to 6 eV peak is not observed in the diamond films deposited by the method of the invention or pure diamond.

(b) The additional energy loss featured in the region labelled $P_2$ and $P_3$ are distinctly different for the pure diamond and graphite structures as shown in the published spectra by F. R. McFeely et al., *Phys. Rev.* B9, 5268 (1974). The maximum in this feature for the diamond film of this invention is at 32 eV and the graphite sample is at 28 eV above $P_0$. The reported range for pure diamond is 31 to 34.1 eV and for pure graphite is 25 to 28 eV.

The origins of these energy loss peaks are as follows. $P_0$ is the C 1s photoionization peak. $P_1$ is due to the plasma oscillation of $p\pi$ type electrons ($\pi$ plasmons) for planar $sp^2$ bonded carbon atoms. Since diamond involves $sp^3$ coordinated carbon, it does not exhibit this feature. For tetrahedrally coordinated carbon, $P_1$ is an interband transition which appears at 11.3 to 12.5 eV above $P_0$. $P_2$, $P_2$ and $P_3$ arise from plasma oscillations of valence electrons. Diamond films of this invention exhibit all of the XPS energy loss features attributed no pure diamond in previous studies.

Figure 7:
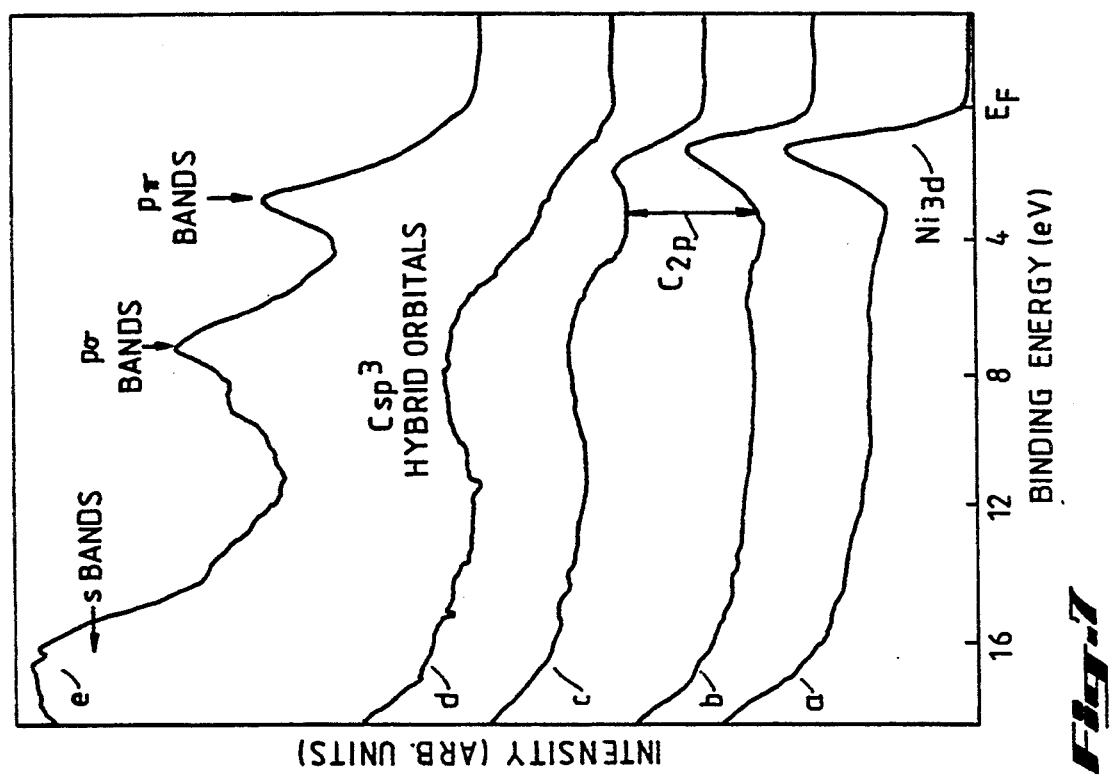
FIG. 7 depicts He II (40.8 eV) ultraviolet photoelectron spectra (UPS) of (a) clean Ni(111) and the same surface after deposition of (b) $4 \times 10^{15}$; (c) $9 \times 10^{15}$; and, (d) $3 \times 10^{16}$ $C^+$ ions/cm$^2$. The spectrum of graphite is shown as (e).

Ultraviolet Photoelectron Spectroscopic Measurements (UPS)—The UPS spectra measured with He II of (a) clean Ni(111) and the same surface after deposition of (b) $4 \times 10^{15}$; (c) $9 \times 10^{15}$; and, (d) $3 \times 10^{16}$ C+ ions/cm$^2$ are shown in FIG. 7. The UPS spectrum of graphite is shown in FIG. 5e. The graphite spectrum is in agreement with previous He I: spectra of pure graphite with He II (40.8 eV) radiation reported by J. A. Taylor, G. M. Lancaster, and J. W. Rabalais, *J. Amer. Chem. Soc.* 100, 4441 (1978). The UPS spectrum of the diamond film of the invention is different from that of graphite and identical to the spectrum of pure diamond as published by B. B. Pate, *Surf. Sci.* 165, 83 (1986).

The absence of the peak at 3 eV for the diamond film of the invention confirms the absence of $p\pi$ type bands. This low energy band extending from the Fermi-level to about 4 eV for graphite is due to the conduction orbitals ($p\pi$ type) that are oriented perpendicular to the layers of graphite rings. For the diamond film of the invention, a recession of the density of occupied states away from the Fermi level is observed, consistent with $sp^3$ hybridization of carbon-carbon bonds and the insulator characteristics of the diamond structure.

Low Energy Electron Diffraction (LEED)—LEED measurements on the diamond films of the invention show that they have an amorphous or polycrystalline structure.

Figure 8B:
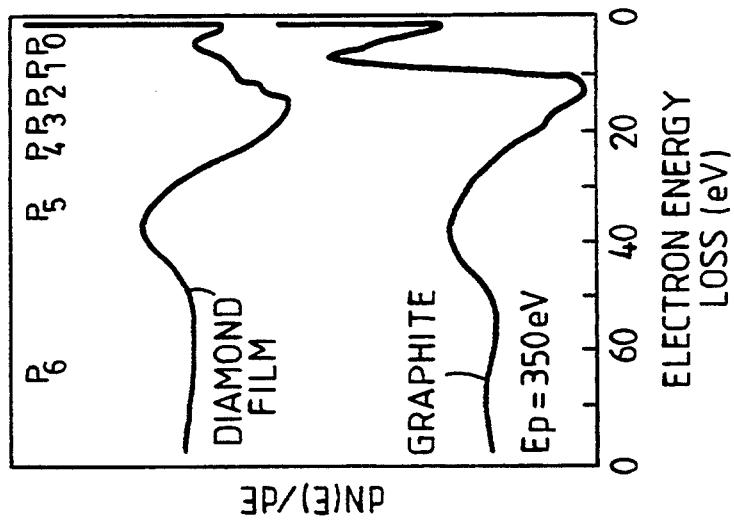
FIGS. 8(a)–8(b) present valence level electron energy loss spectra (ELS) of graphite and a diamond film deposited on Ni(111) measured with electron beam energies of 150 and 350 eV respectively. Energies of the structures $P_i$ are listed in Table I of Kasi et al., *J. Chem. Phys.* 88, 5914 (1988).
Figure 8A:
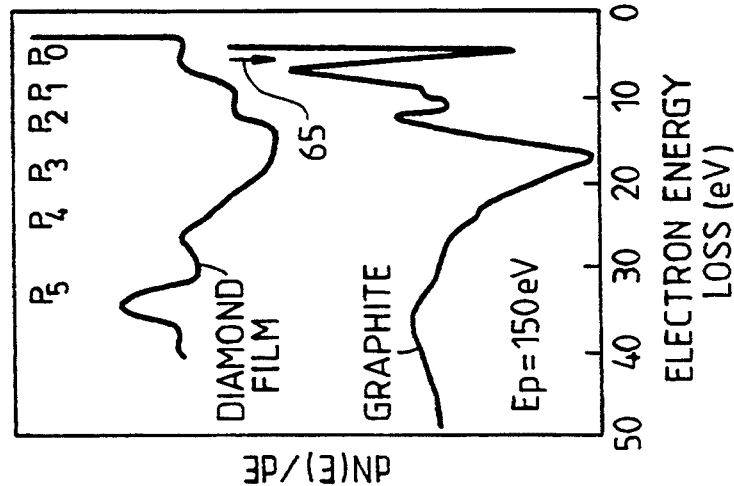

Valance level Electron Energy Loss Spectra (ELS)—ELS spectra of graphite and a diamondlike film deposited on Ni(111) measured with electron beam energies of 150 and 350 eV are shown in FIG. 8. The plasmon loss features have been labelled in the figure. $P_0$ is the elastic scattering peak at the primary energy of 350 and 150 eV. The ELS spectra of the diamond film of the invention are in perfect agreement with the spectra from pure diamond at both energies as published by P. G. Lurie and J. M. Wilson, *Surf. Sci.* 65, 476 (1977). Note that in the 350 eV spectrum, the large $P_1$ peak in graphite is totally absent in the diamond film. This peak is due to p$\pi$ plasmon loss features at about 7 eV, which is characteristic of unsaturated carbon systems having sp$^2$ hybridization. The complete absence of this feature in the diamond films of the invention is characteristic of sp$^3$ type bonding and a diamond structure. In the 150 eV spectra, the large P$_1$ feature of graphite is observed at 6.5 eV while the P$_1$ feature of diamond is much reduced and shifted to 5.0 eV. This P$_1$ feature in diamond arises from electronic excitations of discrete levels within the bandgap. The remaining spectral features, labelled P$_n$ in FIG. 8, of the diamond film of the invention are in perfect agreement with the spectra of pure diamond and distinctly different from those of graphite as published by P. G. Lurie and J. M. Wilson, *Surf. Sci.* 65, 476 (1977). In summary, the ELS spectra confirm that the films of the invention are of a diamond structure and not graphitic.

Figure 9:
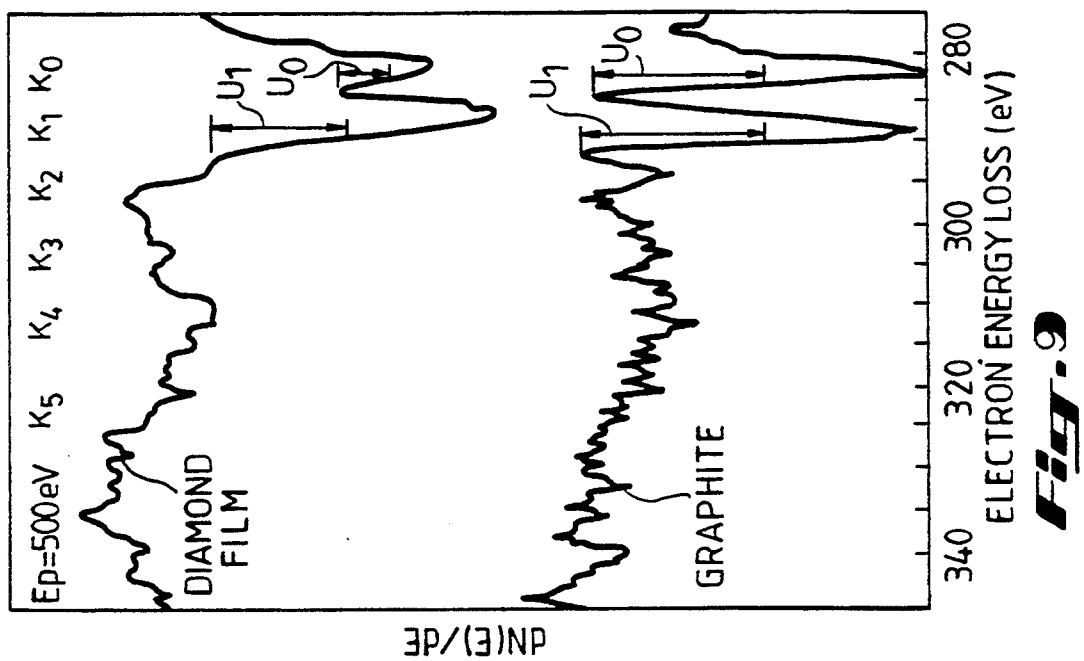
FIG. 9 displays K-shell ionization loss spectra (ILS) for graphite and a deposited diamond film on Si(100). The energies of the $K_i$ features are listed in Table I of Kasi et al., *J. Chem. Phys.* 88, 5914 (1988). $U_i$ represents the half-height of an ILS peak.

K-Shell Ionization Loss Spectra (ILS)—ILS spectra for a diamondlike film deposited on Si(100) and a pyrolyric graphite sample at a primary electron beam energy (E$^p$) of 500 eV are shown in FIG. 9. These spectra correspond to inelastically scattered electrons that have suffered energy losses in exciting K-level carbon electrons above the valence band gap. For graphite, two very intense peaks labelled K$_0$ and K$_1$ are observed. For diamond, K$_1$ is much more intense than K$_0$ and the difference in magnitude reflects the difference in the number of empty states near the Fermi level. The observation of the K$_0$ peak in diamond has been attributed to excitation to empty states in the band gap that are generated by electron beam damage. The ILS spectra are very similar to natural diamond with the exception of a higher intensity in K$_0$. This non-negligible intensity at K$_0$ is due to electron beam damage of the diamond film. The ILS spectra were acquired after the carbon film had been exposed to electron bombardment for purposes of measuring Auger spectra and ELS spectra. In summary, the ILS spectra of the diamond films of the invention are in agreement with that of pure diamond as published by P. G. Lurie and J. M. Wilson, *Surf. Sci.* 65, 476 (1977); and S. V. Pepper, *Appl. Phys. Lett.* 38, 344 (1981).

As noted above, the process may be practiced simultaneously with multiple mass-selected ion beams. Such multibeam systems allow the growth of films having more than one constituent, for example, a developing diamond film could be simultaneously doped to produce a semiconductor of high thermal conductivity in a dual beam apparatus.

Preferably the beam lines in a multibeam apparatus are capable of producing relatively high current (about 10 to 500 microamps), low energy (about 10 to 5000 eV), mass-selected ion beams of useful size (e.g., about 2 cm diameter). The beams may be focused to one spot on the target for simultaneous deposition of films composed of two or more constituents or for doping of a film with very low concentrations of foreign atoms. Alternatively, multiple beams of the same constituent may be used to enhance the deposition rate. It should be understood that this process is not limited to the growth of pure and doped diamond films on substrates, but could be used for growing other films such as SiO$_2$, SiC, BN, and mixed semiconductors (e.g., GaAs, InSb, etc.).

A dual beam ion deposition system is illustrated schematically in FIG. 3. The apparatus consists of a platform on which the following equipment is positioned: two ion sources (negative ion cesium sputtering ion sources and/or positive gas ion sources), two mass analyzer deflection magnets, two einzel lenses, plus equipment to measure and steer the ion beam and maintain good vacuum conditions. The apparatus is designed to allow ion beam currents from both sources to be produced, transported, directed, and decelerated such that they strike a target spot simultaneously at energies in the range of about 10 to 5000 eV, depending on the biasing of the target. UHV deposition chamber 14 houses the sample target, sample manipulator, introduction device, and surface analysis equipment.

In FIG. 3 safety screen 1 (a wire cage) surrounds the beam generating portion of the apparatus which includes ion source 2, extractor and einzel lens 3, pump "T" with y deflection plate 4, a 300 liter per second turbomolecular pump 5 positioned under the pump "T", inflection magnet 6, bellows 7, vacuum chamber with 120 liter per second ion pump 8 positioned under the chamber, pumping restriction-beam selector aperture 9, removable Faraday cup 10, x-y deflection plates 11, einzel focusing lens 12, and deceleration insulator 13. For developmental work, including selection of appropriate parameters, ultrahigh vacuum deposition chamber 14 is preferably equipped with means for in situ surface analysis techniques.

The cesium sputtering ion source can produce ions of most sputterable elements. It employs cesium ions produced by surface ionization on a hot tantalum helix coaxial with a cathode fabricated or coated with the element to be ionized to induce sputtering from the cathode itself. Beams of H$^-$, alkali and transition metals, and nonmetals (C$^-$, B$^-$, P$^-$, As$^-$, Si$^-$) have been routinely produced. The H beam was produced by loading a titanium metal cathode with H$_2$ gas and then using the cathode in the ion source. One of these negative ion sources is interchangeable with an electron impact source for ionization of gaseous molecules and production of positive ion beams. When used in this mode, the beam line voltages are reversed for transport of the positive ions. This source allows production of beams of positive atomic and molecular ions (such as C$^+$, CH$_3^+$, C$_2$H$_5$, etc.) from virtually any compound having sufficient vapor pressure.

In the apparatus illustrated, each ion source is pumped by a 300 liter per second turbomolecular pump. Gate valves are used to isolate these pumps from the sources.

The extractor-einzel lens assembly for each source is preferably arranged to accelerate the ion beam emerging from the source to a maximum of about 24 keV and to focus the beam through the injection magnet onto a pumping restriction-beam selector aperture. The assembly is preferably of all metal and ceramic construction and bakable to about 300° C. The high voltage supplies are most preferably highly regulated to prevent variation of the total beam energy during deposition. Electrostatic steerers are provided after the extractor-einzel lenses to help achieve the correct beam positioning at the pumping restriction-beam selector aperture. The deflection magnets have a mass energy product ME/Z$^2$=1.8 at ±30 degrees, wherein E, and Z are the mass (in amu), energy (in MeV) and the charge of the particle, respectively. A mass resolution of at least about 30 should be obtainable.

The large vacuum chamber includes equipment to measure, direct, and focus the ion beams from the ion sources to the deceleration insulator and target spot. In the apparatus illustrated, two pumping restriction-beam selector apertures are provided at the entrance of the chamber. Two Faraday cups are provided in the chamber to measure beam intensity. The Faraday cups are arranged so that they can be removed or inserted simultaneously to start or stop a dual beam implant or individually for single beam test purposes. Two x-y electrostatic steerers in the chamber assist in directing each beam to the same spot on the target. Electrostatic einzel lenses focus each beam as it diverges from the pumping restriction-beam selector aperture to the target. All the components in the chamber are individually mounted with separate means for adjusting their positions. The chamber is pumped by a 120 liter per second sputter-ion pump. The chamber and its components are of all metal and ceramic construction and can be vacuum baked to 300° C. for an extended period. In the illustrated apparatus the deceleration insulator is about 2.5 inches long and is equipped with high transparent grids at the entrance and the exit to minimize the focusing effects of the deceleration.

The deposition chamber may be a standard UHV chamber which houses the sample holder that is mounted on a precision manipulator. Ports may be provided in this chamber for various in situ surface analysis instruments such as XPS, UPS, AES, LEED, SIMS, TOF ion scattering and recoiling spectrometry, and inert gas ion sputtering. In the illustrated apparatus, pumping is performed with a 300 liter per second ion pump and a titanium sublimation pump. The entire chamber is bakable to about 300° C. for achieving UHV (less than about $10^{-10}$ torr) conditions.

Appropriate beam-producing apparatus including broad-beam (about 2 cm diameter) high current (about 10 to 500 microamps) low-energy (about 10 to 5000 eV) ion sources and power supplies are available from National Electrostatic Corporation (Middleton, Wis. 53562). The ion beam lines preferably include acceleration lenses, a magnetic sector for mass selection, deceleration lenses, means for tastering, pressure gauges, pumps, power supplies, and the like.

A suitable deposition chamber is available from the Physical Electronics Division of Perkin-Elmer Corporation (Bolder, Colo. 80302). This includes the Model 44UL chamber, Model TNB-X pumping well, Model 04-745 linear transport system, and Model 214-0411 titanium sublimation pump.

An appropriate sample introduction and manipulation system is available from the Kurt J. Lesker Company (Clairton, Pa. 15025). This includes the Model VZHPT225 high precision specimen translator, the Model SG-0400MC stainless steel gate valve with copper seal bonnet, and Models VZVPZ38, VZVPZ100 and AZVPZ150 view ports.

A suitable gas introduction system is also available from Kurt J. Lesker Company. This includes Model MD6 fine control leak valves for introducing gases into the ion sources and also into the main deposition chamber.

A dual beam system allows the deposition of binary compounds (e.g., BN, SiC, $SiO_2$) or multilayer compounds. A dual beam deposition system also allows for the simultaneous deposition of carbon along with $H^+$ or $Ar^+$ as well as the possibility of simultaneous doping.

When attempting deposition on insulators, surface charging by accumulation of charged particles when no intrinsic source of electrons is available can pose a problem. Plasma discharges always have sufficient electrons available for neutralization. For ion beam deposition processes surface neutralization can be achieved by providing a stream of electrons from a hot filament.

Investigations utilizing the relatively low current apparatus illustrated in FIGS. 1 and 2 have been directed towards providing rigorous parametric data for diamondlike film growth. This data has been used to gain a better understanding of the physical and chemical mechanisms involved in diamondlike film formation and growth and for the establishment of film growth processes. In these investigations most of the unique features of the mass-selected ion beam deposition technique are utilized. A brief summary is given below of experimental results which illustrate the system performance. More detailed discussions of the experimental results are found in Kang et al., *J. Chem. Phys.* 88, 5882 (1988), Kasi et al., *J. Chem. Phys.* 88, 5914 (1988), Kasi et al., *Phys. Rev. Lett.* 59, 75 (1987), and Rabalais et al., *Science* 239, 623 (1988), the teachings of which are incorporated herein by reference.

The apparatus illustrated in FIGS. 1 and 2 includes means for in situ diagnostics of the chemical nature of the film at different stages of growth. The film evolution at different $C^+$ ion doses has been investigated using different surface analysis techniques (AES, XPS, UPS, ELS, ILS, etc.). Several sequential growth stages were detected: carbidic, intermediate, graphitic, and diamondlike. FIG. 5 shows the Auger lineshapes for different stages of growth. Further parametric studies were based on these results.

Film evolution at room temperature for different $C^+$ ion energies in the range of 1 to 300 eV has been investigated. From the data so generated, the ion energy-ion dose phase relationships have been determined. Carbon ions in the energy of about 30 to 100 eV were found to be uniformly efficient for diamondlike film evolution, while at the lower and higher energies, considerably higher ion doses are required for the evolution of each stage. The final diamondlike structure has not been obtained for energies below about 20 eV, emphasizing the important role of ion kinetic energy. A "phase diagram" constructed for the carbidic through graphitic transformation is presented in FIG. 4.

The initial monolayer of the deposited film is in the form of a carbide layer which is chemically bonded to the substrate atoms for substrates nickel (111), silicon (100), polycrystalline tantalum, tungsten, and gold. The film evolves gradually over the next several layers deposited, through intermediate structures, into a diamond structure. The diamond structure has been confirmed by comparing the results of spectroscopic measurements with those of pure diamond and graphite. The phase diagram shown in FIG. 4, prepared as $C^+$ ion dose versus $C^+$ kinetic energy E, shows the regions of the different structures. The optimum $C^+$ energy range for formation of the diamond structure is about 30 to 175 eV. Below 10 eV the final diamond structure has not been attained and above about 180 eV there is a sharp increase in the dose required to attain this final structure. Auger depth profiles show that the films are free of impurities and that the film-substrate interface is sharp. The films have been found to be inert to $O_2$ chemisorption and have a low sputtering yield.

Figure 10:
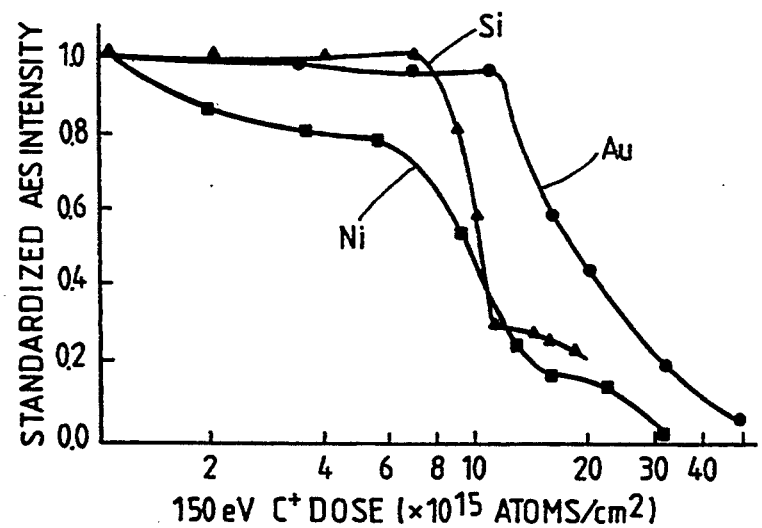
FIG. 10 presents Auger line intensity of the indicated metallic substrates as a function of $C^+$ ion dose at 150 eV. The differences in the graphs indicate different growth rates on different substrates. The two stages of behavior for Si and Ni is indicative of a different growth mechanism than that obtained on Au.
Figure 11:
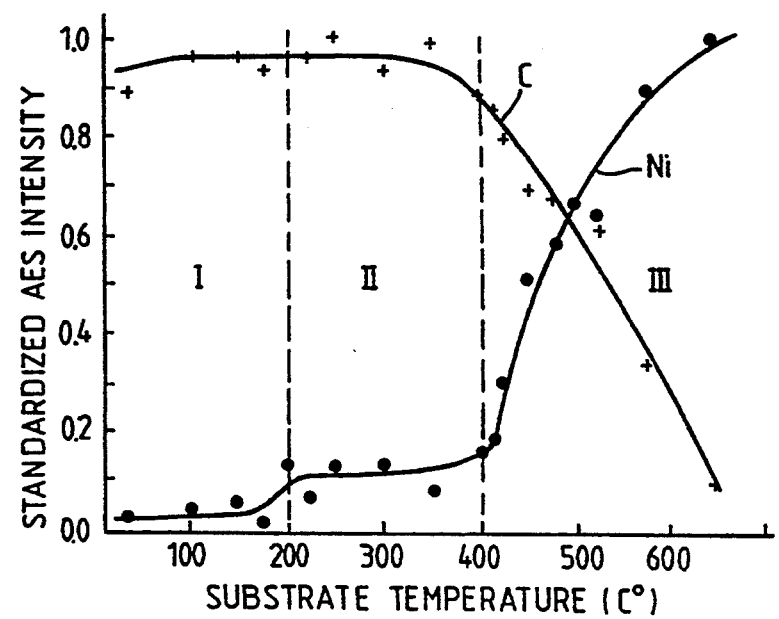
FIG. 11 shows carbon and nickel Auger line intensities of annealed diamond film on Ni(111) at different temperatures. Stage I (T<200° C.) features a very low intensity nickel line and a high intensity, steady carbon line. Stage II (200° C.≦T<400° C.) features an increase in the nickel line intensity at about 200° C. to a steady level with no change in the carbon line intensity or lineshape. Stage III (T≧400° C.) is characterized by a sharp increase in the nickel line intensity; a sharp decrease in the carbon line intensity; and, transformation of the carbon lineshape from diamond shape to graphitic shape.

Film growth on different substrate materials has been investigated. The same qualitative behavior has been detected on nickel (111), silicon (100), and polycrystalline gold, which have been rigorously studied. The same behavior appears to obtain on surfaces of tantalum, tungsten, and germanium. Sharp carbidic interfaces that may be most important for film adhesion have been detected even on substrates for which bulk carbides are not known. The attenuation behavior of the Auger intensities of different substrates with C+ fluence as illustrated in FIG. 10 indicates that the nature of the substrate may affect the mechanism and growth rate for carbon films. Film evolution under a hydrogen background pressure of about $2 \times 10^{-7}$ torr during C+ deposition has been investigated. No significant influence of hydrogen pressure on film evolution was detected. Additionally, co-bombardment with $H_2^+$ ions at energies of about 0.5 to 1.5 keV caused no detectable changes in the film evolution sequence.

Inasmuch as hydrogen is used in many CVD processes for the deposition of diamondlike films, an experiment was performed to determine the effect of the presence of hydrogen during a deposition performed by the process of the present invention. Since hydrogen was not incorporated into the deposited film, it is contemplated that the low energy C+ ions displace chemisorbed hydrogen from the surface. This is not the case for most residual gases and thus the deposition chamber must be substantially free of species such as water vapor, carbon monoxide, carbon dioxide, oxygen, and nitrogen if essentially pure carbon (or other single species) films are desired. In general, the combined partial pressures of residual gases containing carbon, oxygen, and/or nitrogen in the deposition chamber should be less than about $10^{-8}$ torr, more preferably, less than about $10^{-9}$ torr.

Post-deposition annealing of diamondlike films on Ni(111) and gold has also been carried out. The diamondlike films on nickel substrates were found to be unstable under annealing. AES analysis could detect no substrate signal on the as-deposited film prior to annealing. At 200° C., nickel Auger lines appeared. It is contemplated that this may possibly be due to some Ni-C interdiffusion or film recrystallization and island formation. Carbon dissolution in the nickel was detected by an increase in the nickel LMM intensity and a decrease in the carbon KLL line intensity at temperatures exceeding 400° C. A graphitic transformation observed by the changes of the C Auger lineshape was associated with this dissolution. No carbon dissolution was observed on the gold substrates, even at temperatures of 875° C. A pronounced graphitic transformation occurred only at temperatures higher than 600° C.

Film resistance to attack by thermal $O_2$ and to sputtering by different ionic species ($O^+$, $Ne^+$, $Ar^+$) at different energies (about 10 to 300 eV) has been investigated. The diamondlike films obtained by the process of the present invention were found to be inert to $O_2$ chemisorption, unlike graphite or carbide films. The sputtering yield by the ionic species was at least three times lower for the diamondlike film than for carbide films or for the native substrate material.

The nature of the carbon deposit and the evolution of the film can be intimately followed by means of the carbon Auger lineshape. These lineshapes serve as a fingerprint of the chemical environment. The evolution of the carbon KLL Auger lineshape as a function of C+ dose on Ni(111) is shown in FIG. 5. For an initial C+ dose in the range of approximately $2 \times 10^{15}$ to $3 \times 10^{15}$ ions per square centimeter, the lineshape (FIG. 5a) corresponds to that of a carbide ($Ni_nC$). The deposit is approximately one monolayer thick at this stage. FIG. 5b shows the lineshape corresponding to a dose of approximately $6 \times 10^{15}$ to $8 \times 10^{15}$ ions per square centi-
meter, for which metal-carbon composite layers and three-dimensional carbon overlayers begin to grow. With additional C+ deposition, structures characterized by the spectra in FIGS. 5c and 5d develop. The lineshape of FIG. 5c is similar to that of $sp^2$ hybridized graphite, whereas that of FIG. 5d is the characteristic signature of $sp^3$ hybridized diamond. The distinction between diamond and graphite allotropes is even more pronounced in the low-energy portion of the spectrum. Graphite spectra exhibit two peaks at approximately 80 and approximately 110 eV that are absent in diamond spectra.

Figure 4:
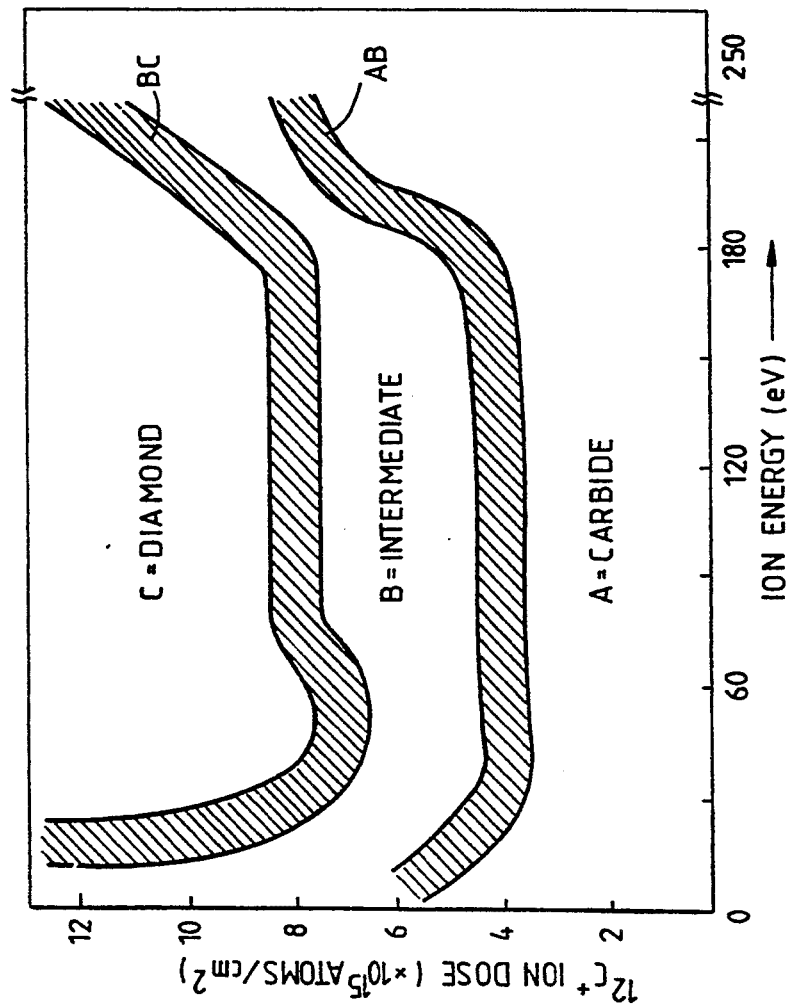
FIG. 4 is a phase diagram as a function of $C^+$ dose and energy for carbon deposition on Ni(111). The characteristic c Auger lineshapes have been used to map out this phase diagram for $C^+$ deposition on Ni(111) as a function of $C^+$ ion dose and energy as shown. Regions A, B, and C correspond to films that show the AES lineshapes depicted in FIG. 5 as spectra a, b, and c, respectively. The final AES lineshape (FIG. 5d) evolves smoothly from that of FIG. 5c, and it is not possible to assign an exact dose to the crossover point. Hence a phase corresponding to FIG. 5d is not shown in this figure (FIG. 4). The hatched regions represent transition zones from one form to another.

The characteristic carbon Auger lineshapes have been used to map out a carbon phase diagram for C+ deposition on Ni(111) as a function of C+ ion dose and energy. This phase diagram is shown in FIG. 4. The AES lineshape (FIG. 5d) evolves smoothly from that of FIG. 5c and it is not possible to assign an exact dose for the crossover point. Hence a phase corresponding to that of FIG. 5d has not been indicated in FIG. 4. For ion energies below 10 eV, the carbon lineshapes do not evolve completely into the final structure of FIG. 5d. In the range from 30 to 175 eV, the transformations are nearly energy-independent. This is the optimum energy for diamond film deposition. For energies greater than about 180 eV, there is a sharp increase in the dose necessary to attain the different phases. In this region, the increasing significance of self-sputtering, lattice damage, and penetration by the C+ ions is thought to be responsible for this phenomenon. For carbon deposition on Si(100) and gold surfaces, the doses necessary to achieve the same transitions as shown in FIG. 5 were higher than those on Ni(111). This sensitivity to this type of substrate surface is thought to arise from the intimate carbide registry with the surface.

Low energy ion beams can be used to deposit films of materials in metastable states. The energy deposited by the ion beam results in a localized transient "thermal spike." It is contemplated that this high energy content region is rapidly quenched by dissipation of energy into the solid. The result is that the deposited material can be trapped in an excited metastable state that persists after the thermal spike has been quenched. For example, using the process of the present invention, carbon ion beams have been used to deposit films of carbon in such a metastable state (i.e., diamond). It is contemplated that similar metastable materials can be prepared from silicon, boron, phosphorous, sulfur, and germanium.

Ion beams are ideally suited to deposition of diamond films inside small holes, apertures, passages, and the like. The ion beam can be directed into apertures that have very small diameters but are long. For example, the process of the present invention has been used to deposit a diamond film on the inside surface of a hole 0.030 inch in diameter and 1 inch long. Some of the carbon ions pas through the hole and emerge at the opposite end; however, there is sufficient divergence in the beam such that ions strike the walls of the aperture and coat it with a diamondlike film.

Thin diamond films can be used for rapid cooling in cryogenic applications. For example, freezedrying of tissues is typically accomplished by rapidly pressing a tissue sample onto a copper block cooled to liquid nitrogen or liquid helium temperatures. There are at least two problems with this. First, the copper block has an oxide coating which is a poor conductor. Second, heat dissipation is limited by the thermal conductivity of the oxide and copper metal. Both of these limitations can be overcome by drilling very tiny holes into the copper block and coating the block and interior of the holes with a diamond film. The film prevents formation of the oxide layer and has a higher thermal conductivity than copper. It also facilitates heat dissipation both laterally along the surface as well as perpendicularly into the bulk of the copper.

As noted above, diamond films can be doped to make semiconductors. This is preferably accomplished by using two beams which impinge on a substrate simultaneously. One is used to deposit the diamond while the other supplies the dopant. The level of doping may be controlled by adjusting the ion current in the beams. Low energies are preferably used so as not to destroy the $sp^3$ hybrid bonding in the diamond structure. An alternative method is to place a container of the dopant near the substrate and heat the container so that the dopant vapor deposits on the substrate simultaneously with the carbon ions from the ion beam.

Semiconducting diamond is an attractive material for integrated circuits because of its large bandgap, high carrier mobilities and saturation velocities, high breakdown field, radiation hardness, and unsurpassed thermal conductivity. These properties suggest the possibility of ultrahigh speed integrated circuits, capable of operating at temperatures upwards of 1000° C. Perhaps the most direct application is in the area of millimeter wave power amplifiers and oscillators. However, other critical potential applications are high speed data processing circuits, supercomputers, and high temperature sensing.

Diamond is known to have a large band gap; those of silicon and germanium are much smaller. Thus, a diamond-based semiconductor offers a better opportunity to tailor the position of the energy levels by the introduction of selected dopants. This implies that improved performance at high frequencies may be had with such a semiconductor. The mobility of charge carriers in diamond is very high and, like semiconductors and unlike most metals, the mobility increases with increasing temperature.

Dopant ionization energies in diamond are typically near 0.3 eV. Thus, only a small fraction of dopant is ionized at room temperature. As a result, diamond devices operating at room temperature exhibit high series resistances due to both the resistance of the bulk semiconductor and of the tunneling contacts. Efficient dopant ionization requires temperatures above about 500° C. This high temperature operating requirement must be considered at the beginning of any diamond device program. It would seem that many technologies which have been developed for silicon (e.g., PSG, aluminum metallization, etc.) will be inappropriate for diamond. Advances in packaging, interlevel dielectric, metallization, and contact technologies must be made before diamond-based integrated circuits can be practical. The necessity for high temperature operation implies that the ultimate speed of diamond devices is still in question. Indeed, the high mobility values (e.g., 2000 $cm^2$/V-sec) often quoted are obtained at room temperature. High temperature values should be smaller. However, it has been shown that the breakdown field at high temperature is good and high temperature operation of a permeable base transistor has been demonstrated.

Doping of diamond is a critical problem. Ion implantation results in defects which cannot be annealed. Under certain conditions these defects act as donors, a result which has been used to fabricate transistors in p-type natural diamond. Doping during microwave plasma CVD growth has been demonstrated for both arsenic and boron. Schottky contacts have been made from a variety of materials including gold, nickel and tungsten. The most important of these are clearly nickel and tungsten because of the high thermal stability of the metal itself and also of the carbide which probably forms at the diamond-tungsten interface. It has been shown that low pressure chemical vapor deposition (LPCVD) silicon dioxide can produce very low surface state densities. This result is critical to development of diamond MOSFETs.

Diamond films on nickel have been found to be unsuitable for high temperature application. Silicon is preferred on technological grounds. This is principally because an extensive crystal growth and fabrication technology already exists and also because silicon's protective oxide makes high temperature operation more reliable than nickel. Silicon substrates have a rather poor lattice match with diamond; the lattices have a common period of three diamond lattice constants to two silicon lattice constants. This implies the potential for epitaxial growth since there is no strain in the bulk epitaxial material even though the interface has considerable defects. Preliminary x-ray diffraction data of diamond films deposited by the process of the present invention on a Si(111) surface shows that the diamond lattice is epitaxially oriented to the silicon lattice. It is contemplated that the non-planar device structures used for GaAs epitaxial transistors and MOSFETs will be most easily transferred to diamond film technology. It if further contemplated that a permeable base transistor could be constructed using all-epitaxial technology. Such a device can be made by existing direct-write electron beam lithography processes with a proven resolution of 0.025 microns and an alignment accuracy of 0.05 microns. Systems for metallization, LPCVD oxide and nitride, LPCVD tungsten, ion assisted evaporation, sputtering, and reactive ion etching are available.

The low energy, room temperature, mass analyzed ion beam deposition methodology of the present invention has been shown to produce chemically bonded films on a variety of substrates. Such films may be crystalline, polycrystalline, or amorphous. The method comprises a dose dependent deposition procedure to assemble stoichiometric films. However, it can also be used as a deposition procedure to assemble non-stoichiometric films. Such films may exhibit high degrees of reactivity because of intrinsic unsaturated valences and therefore can be excellent catalysts for a variety of reactions.

The deposition of diamond films on a variety of substrates would make possible the production of many articles heretofore unattainable. Sharper and more durable machine tools and other cutting tools like knives and surgical scalpels could be made by applying a diamond film to the cutting surfaces of such articles. Magnetic data storage media, aircraft windows, and optical lenses and the like, if coated with a diamond film, would be more abrasion resistant. Coated with a diamond film, silicon or other substrate materials such as nickel could be employed for the production of high density integrated circuits and high power semiconductors. For example, transistors could be fabricated from diamond by adding dopants to give the diamond semiconductor properties. Such transistors could handle high power signals at microwave frequencies.

The deposition technique of the present invention can be used to produce compound thin films from elements that do not typically react. The deposition process can be used to form metastable phases of carbon, silicon, phosphorous, germanium, tin, sulfur, selenium, and gallium.

This process may also be used for the deposition of cubic (diamondlike) boron nitride as well as layered boron nitride (graphitelike). The cubic form of boron nitride is known to scratch diamond itself. The activation energy for transformation to the cubic form is derived from the ion beam energy. Nitridation with low energy (approximately 1 to 150 eV) N+ ions of boron is the deposition route.

The process is also applicable to the deposition of thin films of borides such as $ZrB_2$, $AsB_6$ and $TiB_2$ by using mass-selected boron ions.

The deposition process may be used to produce thin films of carbides of various metals. These include, but are not limited to, silicon, boron, germanium, copper, silver, gold, zinc, cadmium, beryllium, aluminum, yttrium ytterbium, cerium, nickel, tungsten, tantalum, titanium, and calcium.

The process of the present invention may be used to form "zeolite-like" material films from the multistep deposition of individual components. For example, bombardment with aluminum and silicon successively of a metal oxide may lead to oxygen segregation and random metal oxide crystallites may be formed on the surface.

This method may be used to create thin films with properties intermediate between those of the known allotropic forms.

The process may be used to deposit thin films on a material that exhibits no reactivity towards the substrate at thermal energies, such as a carbide film on germanium. The ion beam translational energy is used to overcome reaction barriers.

The deposition method of the present invention can be used in situations wherein films of a particular species to be deposited are chemically bonded to substrates to which they do not typically react. The idea is to form a monolayer of atoms other than the film material itself at the film-substrate interface. This species should be chosen for its ability to chemically bind the substrate surface atoms to the underlayer of the film material itself.

This deposition method combines the chemical reactivity of the impinging species with physical momentum transfer. The consequent elimination of all other species foreign to the film composition aids in the minimization of detrimental surface modifications related to, for example, plasma exposure.

Preparation of coating surfaces is necessary to ensure good adhesion of the film and prevent occlusion of impurities. Cleanliness on an atomic scale is possible by use of a low dosing, reactive ion beam operating at low energy. Most preferably, the source beam is composed of ions of the deposition material itself.

The process may be used to produce a free-standing diamond film by depositing the film on a substrate which is subsequently dissolved or otherwise removed.

Although ultrahigh vacuum conditions are preferred, at high flux, the beam itself may keep the surface atomically clean even at higher pressures.

The process of the present invention can be used to grow an epitaxial diamond layer on monocrystalline silicon with the crystallographic axes aligned with that of the silicon.

Although ion beam deposition is most directly applicable to depositions on surfaces positioned to be substantially perpendicular to the focused ion beam, the inherent divergence in such beams can be employed to coat the surfaces of articles not directly accessible to a line-of-sight deposition. If a diverging ion beam is directed into-the vicinity of a surface ions from the beam can nonetheless impact onto the surface thereby providing the desired thin coating. The decelerator may be specifically tailored to provide the requisite-degree of divergance in the ion beam.

The foregoing description has been directed to particular embodiments of the invention in accordance with the requirements of the United States patent statutes for the purposes of illustration and explanation. It will be apparent to those skilled in this art, however, that many modifications and changes in the methods and compositions set forth will be possible without departing from the scope and the spirit of the invention. It is intended that the following claims be interpreted to embrace all such modifications and changes.

We claim:

1. A method for depositing a chemically bonded carbon based film having a diamond structure on a substrate, comprising the steps of:
   positioning an electrically grounded substrate within a deposition chamber;
   preparing the substrate to have an atomically clean surface and maintaining said surface in an atomically clean state during deposition by maintaining the pressure within the deposition chamber at or below $1 \times 10^{-8}$ torr;
   generating from a carbon containing material a source of gaseous ions in an ionization region maintained at 1 to 300 eV above the grounded substrate;
   directing ions from the ionization region into electromagnetic mass analyzer;
   selecting $^{12}C^+$ ions to exit from the mass analyzer;
   directing said $^{12}C^+$ ion beam through a bend by passing said beam through a parallel plate condenser to eliminate line-of-sight neutral particles from said ion beam;
   directing said $^{12}C^+$ ion beam through a decelerator lens immediately in front of said substrate;
   impinging said ion beam on the atomically clean substrate surface at a beam energy sufficient to form a carbon layer bound to said substrate surface by carbide bonding; and,
   impinging said ion beam on said carbide bound carbon layer at a beam energy of at least about 10 eV for a time sufficient to overlay said carbide bound carbon layer with a diamond layer, said diamond layer being substantially free from hydrogen or oxygen.

2. The method of claim 1 wherein the ion beam is impinged upon said substrate at an energy of from about 10 eV to about 250 eV.

3. The method of claim 1 wherein the energy of the impinging ion beam is from about 30 eV to about 175 eV.

4. The method of claim 1 wherein the substrate is Al, Ba, Ca, Fe, Mn, Mo, Ni, Si, Sr, Ta, Th, Ti, W, V, Zr, an alloy or mixture thereof.

5. The method of claim 1 wherein the substrate is Cr, Co, Cu, Pb, Mg, Pd, Pt, Sn, Zn, an alloy or mixture thereof.

6. The method of claim 1 wherein the substrate is Ni, Si, Au, Ta, or W.

7. The process recited in claim 1 wherein the substrate comprises magnetic data storage media.

8. A carbon based film deposited by ion beam deposition upon a substrate, comprising:
an anterior carbon layer substantially free of hydrogen or oxygen and having a diamond microstructure wherein the anterior layer overlays and is chemically bonded to a posterior atomic layer of carbon that is chemically bound to said substrate surface by carbide bonding.

* * * * *

UNITED STATES PATENT AND TRADEMARK OFFICE
CERTIFICATE OF CORRECTION

PATENT NO. : 5,374,318
DATED : December 20, 1994
INVENTOR(S) : John W. Rabalais et al Page 1 of 2

It is certified that error appears in the above-indentified patent and that said Letters Patent is hereby corrected as shown below:

Column 8, line 65, "K-shell" should be --$\underline{K}$-shell--.

Column 10, line 18, after "$C^+$" add --ion--.

Column 10, line 34, "$>x10^{16}$" should be --$>2x10^{16}$--.

Column 11, line 18, "100" should be --10--.

Column 11, line 48, "ever" should be --over--.

Column 12, line 50, "TOE" should be --TOF--.

Column 18, line 27, "nave" should be --have--.

Column 18, line 58, "ASS" should be --AES--.

Column 20, line 36, "He I" should be --He II--.

Column 22, line 32, "H" should be --$H^-$--.

UNITED STATES PATENT AND TRADEMARK OFFICE
CERTIFICATE OF CORRECTION

PATENT NO. : 5,374,318
DATED : December 20, 1994
INVENTOR(S) : John W. Rabalais et al It is certified that error appears in the above-indentified patent and that said Letters Patent is hereby corrected as shown below:

Column 23, line 38, "tastering" should be --rastering--.

Column 27, line 21, "bandgap" should be --band gap--.

Column 28, line 30, "if" should be --is--.

Signed and Sealed this

Eleventh Day of April, 1995

*Attest:*

BRUCE LEHMAN

*Attesting Officer*  Commissioner of Patents and Trademarks